(12) United States Patent
Feng et al.

(10) Patent No.: US 10,923,208 B2
(45) Date of Patent: Feb. 16, 2021

(54) SHIFT REGISTER UNIT, SHIFT REGISTER CIRCUIT AND DISPLAY DEVICE

(71) Applicants: Hefei Xinsheng Optoelectronics Technology Co., Ltd., Hefei (CN); BOE TECHNOLOGY GROUP CO., LTD., Beijing (CN)

(72) Inventors: Xuehuan Feng, Beijing (CN); Yongqian Li, Beijing (CN)

(73) Assignees: Hefei Xinsheng Optoelectronics Technology Co., Ltd., Hefei (CN); BOE TECHNOLOGY GROUP CO., LTD., Beijing (CN)

(*) Notice: Subject to any disclaimer, the term of this patent is extended or adjusted under 35 U.S.C. 154(b) by 3 days.

(21) Appl. No.: 16/533,110

(22) Filed: Aug. 6, 2019

(65) Prior Publication Data

US 2020/0051656 A1    Feb. 13, 2020

(30) Foreign Application Priority Data

Aug. 7, 2018  (CN) .......................... 2018 1 0891568

(51) Int. Cl.
*G11C 19/28* (2006.01)
*G09G 3/3266* (2016.01)

(52) U.S. Cl.
CPC ............ *G11C 19/28* (2013.01); *G09G 3/3266* (2013.01); *G11C 19/287* (2013.01); *G09G 2310/0286* (2013.01); *G09G 2320/0252* (2013.01)

(58) Field of Classification Search
CPC ......... G09G 3/3266; G09G 2310/0286; G09G 2320/0252; G11C 19/28; G11C 19/287
See application file for complete search history.

(56) References Cited

U.S. PATENT DOCUMENTS

| 2020/0020266 A1* | 1/2020 | Feng | G11C 19/28 |
| 2020/0027516 A1* | 1/2020 | Feng | G09G 3/3266 |
| 2020/0051507 A1* | 2/2020 | Feng | G09G 3/3266 |

\* cited by examiner

*Primary Examiner* — Patrick O Neill
(74) *Attorney, Agent, or Firm* — Thomas|Horstemeyer, LLP

(57) ABSTRACT

The present disclosure relates to the field of display technologies and, more particularly, to a shift register unit, a shift register circuit, and a display device. The shift register unit includes a detection input circuit, a display input circuit, an inverter circuit, a pull-down circuit, a reset circuit, and a first output circuit. In a working process of the shift register unit, the display input circuit and the detection input circuit share the inverter circuit, the pull-down circuit, the reset circuit, and the first output circuit.

20 Claims, 5 Drawing Sheets

SHIFT REGISTER UNIT, SHIFT REGISTER CIRCUIT AND DISPLAY DEVICE

CROSS-REFERENCE TO RELATED APPLICATION

This application is based upon and claims priority to Chinese Patent Application No. 201810891568.5, filed on Aug. 7, 2018, the entire contents thereof being incorporated in their entirety by reference herein.

TECHNICAL FIELD

The present disclosure relates to the field of display technologies and, more particularly, to a shift register unit, a shift register circuit, and a display device.

BACKGROUND

In the field of display technologies, particularly in the field of OLED display devices, shift register units are integrated in driver integrated circuits (ICs). In the design process of driver ICs, the topic of how to effectively reduce chip areas of the driver ICs so as to reduce costs of the driver ICs has become important to research and development personnel.

Presently, the shift register unit generally is composed of three subcircuits, i.e., a detection subcircuit, a display subcircuit, and a connection unit configured to output a pulse for the detection subcircuit and the display subcircuit.

Understandably, the circuit structure of the above shift register unit is very complicated and the chip area is large, and thus, the above shift register unit cannot satisfy the requirements for high resolution and narrow bezel in display devices. In addition, the data writing time is short during high-frequency driving, which may lead to a phenomenon of abnormal display caused by short charging time.

It is to be noted that the above information disclosed in this Background section is only for enhancement of understanding of the background of the present disclosure and therefore, it may contain information that does not form the related art or information that is already known to a person of ordinary skill in the art.

SUMMARY

The present disclosure provides a shift register unit, a shift register circuit, and a display device.

According to an aspect of the present disclosure, there is provided a shift register unit, which includes:

a detection input circuit coupled to a first clock signal terminal, a second clock signal terminal, a third clock signal terminal, a first input terminal, a first power signal terminal, a pull-up node, and a first node, and configured to transmit a signal from the third clock signal terminal to the pull-up node in response to a signal from the first clock signal terminal and a signal from the second clock signal terminal;

a display input circuit coupled to a second input terminal, the pull-up node, and a second power signal terminal, and configured to transmit a signal from the second power signal terminal to the pull-up node in response to a signal from the second input terminal;

an inverter circuit coupled to a third power signal terminal, the pull-up node, a pull-down node, the first node, and the first power signal terminal, and configured to transmit a signal from the third power signal terminal to the pull-down node in response to the signal from the third power signal terminal, transmit a signal from the first power signal terminal to the pull-down node in response to a signal from the pull-up node, and transmit the signal from the first power signal terminal to the pull-up node in response to a signal from the pull-down node;

a pull-down circuit coupled to the pull-down node, the first power signal terminal, a fourth power signal terminal, an output terminal, and a first signal output terminal, and configured to, in response to the signal from the pull-down node, transmit the signal from the first power signal terminal to the output terminal and transmit a signal from the fourth power signal terminal to the first signal output terminal;

a reset circuit coupled to the second clock signal terminal, the pull-up node, the first power signal terminal, the third input terminal, and the first node, and configured to transmit the signal from the first power signal terminal to the pull-up node in response to the signal from the second clock signal terminal and transmit the signal from the first power signal terminal to the pull-up node in response to a signal from the third input terminal; and a first output circuit coupled to a fourth clock signal terminal, the pull-up node, the output terminal, and the first signal output terminal, and configured to transmit a signal from the fourth clock signal terminal to the output terminal and the first signal output terminal in response to the signal from the pull-up node.

In an exemplary embodiment of the present disclosure, the shift register unit further includes:

a feedback circuit coupled to the pull-up node, the first node, and the second power signal terminal, and configured to communicate the second power signal terminal with the first node in response to the signal from the pull-up node;

In an exemplary embodiment of the present disclosure, the shift register unit further includes:

a feedback circuit coupled to the output terminal, the first signal output terminal, and the first node, and configured to communicate the first signal output terminal with the first node in response to a signal from the output terminal;

In an exemplary embodiment of the present disclosure, the third power signal terminal includes a first power subsignal terminal and a second power subsignal terminal.

The inverter circuit is coupled to the first power subsignal terminal, the second power subsignal terminal, the pull-up node, the pull-down node, the first node, and the first power signal terminal, and is configured to alternately transmit a signal from the first power subsignal terminal and a signal from the second power subsignal terminal to the pull-down node in alternate response to the signal from the first power subsignal terminal and the signal from the second power subsignal terminal, transmit the signal from the first power signal terminal to the pull-down node in response to the signal from the pull-up node, and transmit the signal from the first power signal terminal to the pull-up node in response to the signal from the pull-down node. The signal from the first power subsignal terminal and the signal from the second power subsignal terminal are reverse signals with the same frequency.

In an exemplary embodiment of the present disclosure, the shift register unit further includes:

a current detection subcircuit coupled to the first input terminal, and configured to detect a signal from the first input terminal; and a signal generation subcircuit coupled to the current detection subcircuit and the second clock signal terminal, and configured to generate an off signal according to the signal from the first input terminal detected by the current detection subcircuit and transmit the off signal to the second clock signal terminal.

In an exemplary embodiment of the present disclosure, the shift register unit further includes:

a second output circuit coupled to a fifth clock signal terminal, the pull-up node, the second signal output terminal, the pull-down node, and the fourth power signal terminal, and configured to transmit a signal from the fifth clock signal terminal to the second signal output terminal in response to the signal from the pull-up node and transmit the signal from the fourth power signal terminal to the second signal output terminal in response to the signal from the pull-down node.

In an exemplary embodiment of the present disclosure, the inverter circuit includes:

a sixth switching element, a control terminal, and a first terminal of the sixth switching element being coupled to the third power signal terminal, and a second terminal of the sixth switching element being coupled to the pull-down node;

a seventh switching element, a control terminal of the seventh switching element being coupled to the pull-up node, a first terminal of the seventh switching element being coupled to the pull-down node, and a second terminal of the seventh switching element being coupled to the first power signal terminal;

an eighth switching element, a control terminal of the eighth switching element being coupled to the pull-down node and a first terminal of the eighth switching element being coupled to the pull-up node;

a ninth switching element, a control terminal of the ninth switching element being coupled to the pull-down node, a first terminal of the ninth switching element being coupled to the second terminal of the eighth switching element, and a second terminal of the ninth switching element being coupled to the first power signal terminal.

In an exemplary embodiment of the present disclosure, the inverter circuit includes:

a sixth switching element, a control terminal and a first terminal of the sixth switching element being coupled to the first power subsignal terminal, and a second terminal of the sixth switching element being coupled to the pull-down node;

a seventh switching element, a control terminal of the seventh switching element being coupled to the pull-up node, a first terminal of the seventh switching element being coupled to the pull-down node, and a second terminal of the seventh switching element being coupled to the first power signal terminal;

an eighth switching element, a control terminal of the eighth switching element being coupled to the pull-down node, and a first terminal of the eighth switching element being coupled to the pull-up node;

a ninth switching element, a control terminal of the ninth switching element being coupled to the pull-down node, a first terminal of the ninth switching element being coupled to the second terminal of the eighth switching element, and a second terminal of the ninth switching element being coupled to the first power signal terminal; and an eighteenth switching element, a control terminal and a first terminal of the eighteenth switching element being coupled to the second power subsignal terminal, and a second terminal of the eighteenth switching element being coupled to the pull-down node.

In an exemplary embodiment of the present disclosure, the feedback circuit includes a seventeenth switching element. A control terminal of the seventeenth switching element is coupled to the pull-up node, a first terminal of the seventeenth switching element is coupled to the second power signal terminal, and a second terminal of the seventeenth switching element is coupled to the first node.

In an exemplary embodiment of the present disclosure, the feedback circuit includes a seventeenth switching element. A control terminal of the seventeenth switching element is coupled to the output terminal, a first terminal of the seventeenth switching element is coupled to the first node, and a second terminal of the seventeenth switching element is coupled to the first signal output terminal.

In an exemplary embodiment of the present disclosure, the second output circuit includes:

a nineteenth switching element, a control terminal of the nineteenth switching element being coupled to the pull-up node, a first terminal of the nineteenth switching element being coupled to the fifth clock signal terminal, and a second terminal of the nineteenth switching element being coupled to the second signal output terminal; and a twentieth switching element, a control terminal of the twentieth switching element being coupled to the pull-down node, a first terminal of the twentieth switching element being coupled to the second signal output terminal, and a second terminal of the twentieth switching element being coupled to the fourth power signal terminal.

In an exemplary embodiment of the present disclosure, the detection input circuit includes:

a first switching element, a control terminal of the first switching element being coupled to the second clock signal terminal, and a first terminal of the first switching element being coupled to the first input terminal;

a first storage capacitor, a first terminal of the first storage capacitor being coupled to the second terminal of the first switching element, and a second terminal of the first storage capacitor being coupled to the first power signal terminal;

a second switching element, a control terminal of the second switching element being coupled to the second terminal of the first switching element, and a first terminal of the second switching element being coupled to the third clock signal terminal;

a third switching element, a control terminal of the third switching element being coupled to the first clock signal terminal, and a first terminal of the third switching element being coupled to a second terminal of the second switching element; and a fourth switching element, a control terminal of the fourth switching element being coupled to the first clock signal terminal, a first terminal of the fourth switching element being coupled to the second terminal of the third switching element, and a second terminal of the fourth switching element being coupled to the pull-up node.

The display input circuit includes:

a fifth switching element, a control terminal of the fifth switching element being coupled to the second input terminal, a first terminal of the fifth switching element being coupled to the second power signal terminal, and a second terminal of the fifth switching element being coupled to the pull-up node.

The pull-down circuit includes:

a tenth switching element, a control terminal of the tenth switching element being coupled to the pull-down node, a first terminal of the tenth switching element being coupled to the output terminal, and a second terminal of the tenth switching element being coupled to the first power signal terminal; and an eleventh switching element, a control terminal of the eleventh switching element being coupled to the pull-down node, a first terminal of the eleventh switching element being coupled to the first signal output terminal, and a second terminal of the eleventh switching element being coupled to the fourth power signal terminal.

The reset circuit includes:

a twelfth switching element, a control terminal of the twelfth switching element being coupled to the third input terminal, a first terminal of the twelfth switching element being coupled to the pull-up node, and a second terminal of the twelfth switching element being coupled to the first node;

a thirteenth switching element, a control terminal of the thirteenth switching element being coupled to the third input terminal, a first terminal of the thirteenth switching element being coupled to the first node, and a second terminal of the thirteenth switching element being coupled to the first power signal terminal; and a fourteenth switching element, a control terminal of the fourteenth switching element being coupled to the second clock signal terminal, a first terminal of the fourteenth switching element being coupled to the pull-up node, and a second terminal of the fourteenth switching element being coupled to the first power signal terminal.

The first output circuit includes:

a second storage capacitor, a first terminal of the second storage capacitor being coupled to the pull-up node, and a second terminal of the second storage capacitor being coupled to the output terminal;

a fifteenth switching element, a control terminal of the fifteenth switching element being coupled to the pull-up node, a first terminal of the fifteenth switching element being coupled to the fourth clock signal terminal, and a second terminal of the fifteenth switching element being coupled to the output terminal; and a sixteenth switching element, a control terminal of the sixteenth switching element being coupled to the pull-up node, a first terminal of the sixteenth switching element being coupled to the fourth clock signal terminal, and a second terminal of the sixteenth switching element being coupled to the first signal output terminal.

According to an aspect of the present disclosure, there is provided a shift register circuit, which includes a plurality of the shift register units according to any one of the above embodiments.

A first clock signal terminal of the shift register unit in an $N^{th}$ row receives a first clock signal, and a first clock signal terminal of the shift register unit in an $(N+1)^{th}$ row receives the first clock signal.

A second clock signal terminal of the shift register unit in the $N^{th}$ row receives a second clock signal, and a third clock signal terminal of the shift register unit in the $N^{th}$ row receives a third clock signal.

A third clock signal terminal of the shift register unit in the $(N+1)^{th}$ row receives the second clock signal, and a second clock signal terminal of the shift register unit in the $(N+1)^{th}$ row receives the third clock signal.

An output terminal of the shift register unit in the $N^{th}$ row is respectively coupled to a first input terminal of the shift register unit in the $(N+1)^{th}$ row and a second input terminal of the shift register unit in the $(N+2)^{th}$ row.

An output terminal of the shift register unit in the $(N+1)^{th}$ row is respectively coupled to a first input terminal of the shift register unit in the $(N+2)^{th}$ row and a second input terminal of the shift register unit in the $(N+3)^{th}$ row.

A third input terminal of the shift register unit in the $N^{th}$ row is coupled to an output terminal of the shift register unit in the $(N+3)^{th}$ row.

A first input terminal and a second input terminal of the shift register unit in a first row and a second input terminal of the shift register unit in a second row receive a drive signal, wherein the N is an odd number or an even number.

In an exemplary embodiment of the present disclosure, the fourth clock signal terminal of the first stage shift register unit to the last stage shift register unit sequentially and cyclically receives a sixth clock signal to a ninth clock signal, wherein the sixth clock signal overlaps with a seventh clock signal, the seventh clock signal overlaps with an eighth clock signal, and the eighth clock signal overlaps with the ninth clock signal.

According to an aspect of the present disclosure, there is provided a display device, which includes the shift register unit according to any one of the above embodiments, or the shift register circuit according to any one of the above embodiments.

BRIEF DESCRIPTION OF THE DRAWINGS

The above and other features and advantages of the present disclosure will become more apparent by describing in detail the exemplary embodiments thereof with reference to the accompanying drawings. Understandably, the accompanying drawings in the following description show merely some embodiments of the present disclosure, and persons of ordinary skill in the art may still derive other drawings from these accompanying drawings without creative effort. In the drawings.

DETAILED DESCRIPTION

Figure 1:
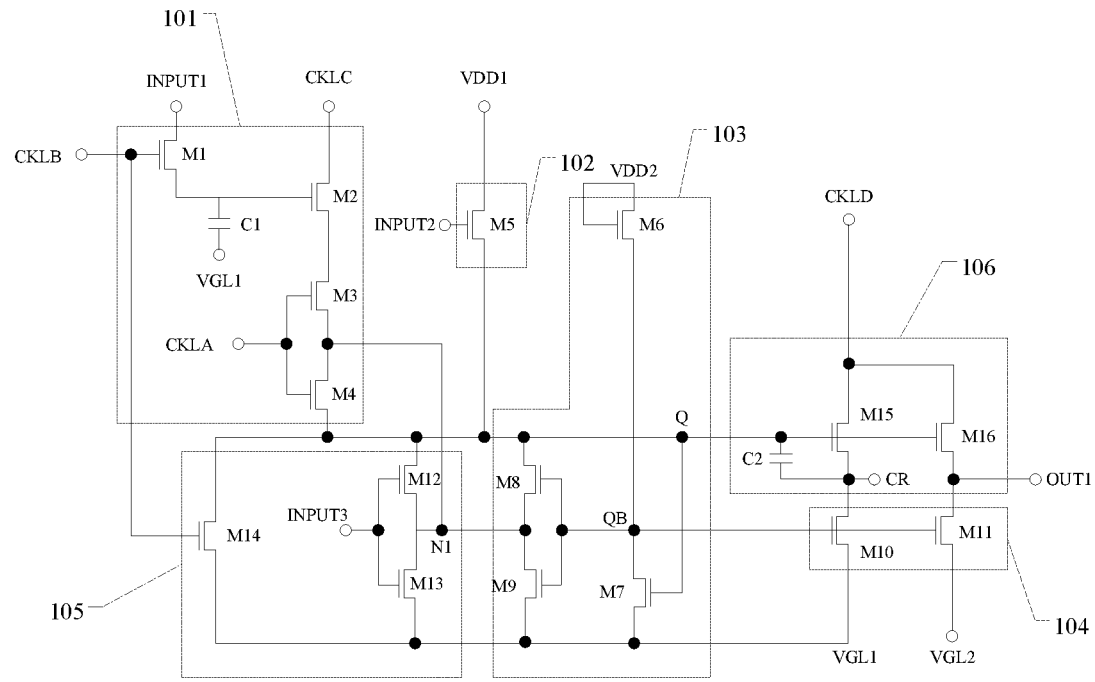
FIG. 1 is a structural schematic diagram I of a shift register unit according to an exemplary embodiment of the present disclosure.

The exemplary embodiment will now be described more fully with reference to the accompanying drawings. However, the exemplary embodiments can be implemented in a variety of forms and should not be construed as limited to the embodiments set forth herein. Rather, the embodiments are provided so that this disclosure will be thorough and complete and will fully convey the concepts of exemplary embodiments to those skilled in the art. The features, structures, or characteristics described may be combined in one or more embodiments in any suitable manner. In the following description, numerous specific details are provided to give a full understanding of the embodiments of the present disclosure. However, those skilled in the art will appreciate that one or more of the specific details may be practiced without practicing the technical solutions of the present disclosure, and other methods, components, materials, devices, steps, and the like may be employed. In other instances, well-known technical solutions are not shown or described in detail to avoid obscuring aspects of the present disclosure.

In addition, the accompanying drawings are merely exemplary illustrations of the present disclosure, and are not necessarily drawn to scale. The same reference numerals in the drawings denote the same or similar parts, and thus, repeated description thereof will be omitted.

This exemplary embodiment provides a shift register unit. As shown in FIG. 1, the shift register unit may include: a detection input circuit 101, a display input circuit 102, an inverter circuit 103, a pull-down circuit 104, a reset circuit 105, and a first output circuit 106.

The detection input circuit 101 is coupled to a first clock signal terminal CKLA, a second clock signal terminal CKLB, a third clock signal terminal CKLC, a first input terminal INPUT1, a first power signal terminal VGL1, a pull-up node Q and a first node N1, and is configured to transmit a signal from the third clock signal terminal CKLC to the pull-up node Q in response to a signal from the first clock signal terminal CKLA and a signal from the second clock signal terminal CKLB.

The display input circuit 102 is coupled to a second input terminal INPUT2, the pull-up node Q, and a second power signal terminal VDD1, and is configured to transmit a signal from the second power signal terminal VDD1 to the pull-up node Q in response to a signal from the second input terminal INPUT2.

The inverter circuit 103 is coupled to a third power signal terminal VDD2, the pull-up node Q, a pull-down node QB, the first node N1, and the first power signal terminal VGL1, and is configured to transmit a signal from the third power signal terminal VDD2 to the pull-down node QB in response to the signal from the third power signal terminal VDD2, transmit a signal from the first power signal terminal VGL1 to the pull-down node QB in response to a signal from the pull-up node Q, and transmit the signal from the first power signal terminal VGL1 to the pull-up node Q in response to a signal from the pull-down node QB.

The pull-down circuit 104 is coupled to the pull-down node QB, the first power signal terminal VGL1, a fourth power signal terminal VGL2, an output terminal OCR and, a first signal output terminal OUT1, and is configured to transmit the signal from the first power signal terminal VGL1 to the output terminal OCR in response to the signal from the pull-down node QB and transmit a signal from the fourth power signal terminal VGL2 to the first signal output terminal OUT1.

The reset circuit 105 is coupled to the second clock signal terminal CKLB, the pull-up node Q, the first power signal terminal VGL1, the third input terminal INPUT3, and the first node N1, and is configured to transmit the signal from the first power signal terminal VGL1 to the pull-up node Q in response to the signal from the second clock signal terminal CKLB and transmit the signal from the first power signal terminal VGL1 to the pull-up node Q in response to a signal from the third input terminal INPUT3.

The first output circuit 106 is coupled to a fourth clock signal terminal CLKD, the pull-up node Q, the output terminal OCR, and the first signal output terminal OUT1, and is configured to transmit a signal from the fourth clock signal terminal CLKD to the output terminal OCR and the first signal output terminal OUT1 in response to the signal from the pull-up node Q.

In the working process of the shift register unit, the display input circuit and the detection input circuit share the inverter circuit, the pull-down circuit, the reset circuit, and the first output circuit, which greatly simplifies the circuit structure of the shift register unit and also, greatly reduces signal lines, thereby greatly reducing the area of the shift register circuit and meeting the requirements of high resolution and narrow bezel.

Specific structures and connection modes of circuits in the shift register unit are described in detail below with reference to FIG. 1.

The detection input circuit 101 may include:
a first switching element M1, a control terminal of the first switching element M1 being coupled to the second clock signal terminal CKLB, and a first terminal of the first switching element M1 being coupled to the first input terminal INPUT1;
a first storage capacitor C1, a first terminal of the first storage capacitor C1 being coupled to the second terminal of the first switching element M1, and a second terminal of the first storage capacitor C1 being coupled to the first power signal terminal VGL1;
a second switching element M2, a control terminal of the second switching element M2 being coupled to the second terminal of the first switching element M1, and a first terminal of the second switching element M2 being coupled to the third clock signal terminal CLKC;
a third switching element M3, a control terminal of the third switching element M3 being coupled to the first clock signal terminal CLKA, and a first terminal of the third switching element M3 being coupled to a second terminal of the second switching element M2; and
a fourth switching element M4, a control terminal of the fourth switching element M4 being coupled to the first clock signal terminal CLKA, a first terminal of the fourth switching element M4 being coupled to the second terminal of the third switching element M3, and a second terminal of the fourth switching element M4 being coupled to the pull-up node Q.

The display input circuit 102 may include:
a fifth switching element M5, a control terminal of the fifth switching element M5 being coupled to the second input terminal INPUT2, a first terminal of the fifth switching element M5 being coupled to the second power signal terminal VDD1, and a second terminal of the fifth switching element M5 being coupled to the pull-up node Q.

The pull-down circuit 104 may include:
a tenth switching element M10, a control terminal of the tenth switching element M10 being coupled to the pull-down node QB, a first terminal of the tenth switching element M10 being coupled to the output terminal OCR, and a second terminal of the tenth switching element M10 being coupled to the first power signal terminal VGL1; and
an eleventh switching element M11, a control terminal of the eleventh switching element M11 being coupled to the pull-down node QB, a first terminal of the eleventh switching element M11 being coupled to the first signal output terminal OUT1, and a second terminal of the eleventh switching element M11 being coupled to the fourth power signal terminal VGL2.

The reset circuit 105 may include:

a twelfth switching element M12, a control terminal of the twelfth switching element M12 being coupled to the third input terminal INPUT3, a first terminal of the twelfth switching element M12 being coupled to the pull-up node Q, and a second terminal of the twelfth switching element M12 being coupled to the first node N1;

a thirteenth switching element M13, a control terminal of the thirteenth switching element M13 being coupled to the third input terminal INPUT3, a first terminal of the thirteenth switching element M13 being coupled to the first node N1, and a second terminal of the thirteenth switching element M13 being coupled to the first power signal terminal VGL1; and a fourteenth switching element M14, a control terminal of the fourteenth switching element M14 being coupled to the second clock signal terminal CKLB, a first terminal of the fourteenth switching element M14 being coupled to the pull-up node Q, and a second terminal of the fourteenth switching element M14 being coupled to the first power signal terminal VGL1.

The first output circuit 106 may include:

a second storage capacitor C2, a first terminal of the second storage capacitor C2 being coupled to the pull-up node Q, and a second terminal of the second storage capacitor C2 being coupled to the output terminal OCR;

a fifteenth switching element M15, a control terminal of the fifteenth switching element M15 being coupled to the pull-up node Q, a first terminal of the fifteenth switching element M15 being coupled to the fourth clock signal terminal CKLD, and a second terminal of the fifteenth switching element M15 being coupled to the output terminal OCR; and a sixteenth switching element M16, a control terminal of the sixteenth switching element M16 being coupled to the pull-up node Q, a first terminal of the sixteenth switching element M16 being coupled to the fourth clock signal terminal CKLD, and a second terminal of the sixteenth switching element M16 being coupled to the first signal output terminal OUT1.

The inverter circuit 103 may include:

a sixth switching element M6, a control terminal and a first terminal of the sixth switching element M6 being coupled to the third power signal terminal VDD2, and a second terminal of the sixth switching element M6 being coupled to the pull-down node QB;

a seventh switching element M7, a control terminal of the seventh switching element M7 being coupled to the pull-up node Q, a first terminal of the seventh switching element M7 being coupled to the pull-down node QB, and a second terminal of the seventh switching element M7 being coupled to the first power signal terminal VGL1;

an eighth switching element M8, a control terminal of the eighth switching element M8 being coupled to the pull-down node QB, and a first terminal of the eighth switching element M8 being coupled to the pull-up node Q; and a ninth switching element M9, a control terminal of the ninth switching element M9 being coupled to the pull-down node QB, a first terminal of the ninth switching element M9 being coupled to the second terminal of the eighth switching element M8, and a second terminal of the ninth switching element M9 being coupled to the first power signal terminal VGL1.

In this exemplary embodiment, the first switching element to the sixteenth switching element (M1~M16) may respectively correspond to the first switching transistor to the sixteenth switching transistor, and each switching transistor has a control terminal, a first terminal, and a second terminal. Specifically, the control terminal of each switching transistor may be a gate, the first terminal thereof may be a source, and the second terminal thereof may be a drain. Alternatively, the control terminal of each switching transistor may be a gate, the first terminal thereof may be a drain, and the second terminal thereof may be a source. In addition, each of the switching transistors may be an enhancement transistor or a depletion transistor, which is not particularly limited by this exemplary embodiment. In addition, each of the switching transistors may be an N-type transistor or a P-type transistor, which is not particularly limited by this exemplary embodiment.

Figure 2:
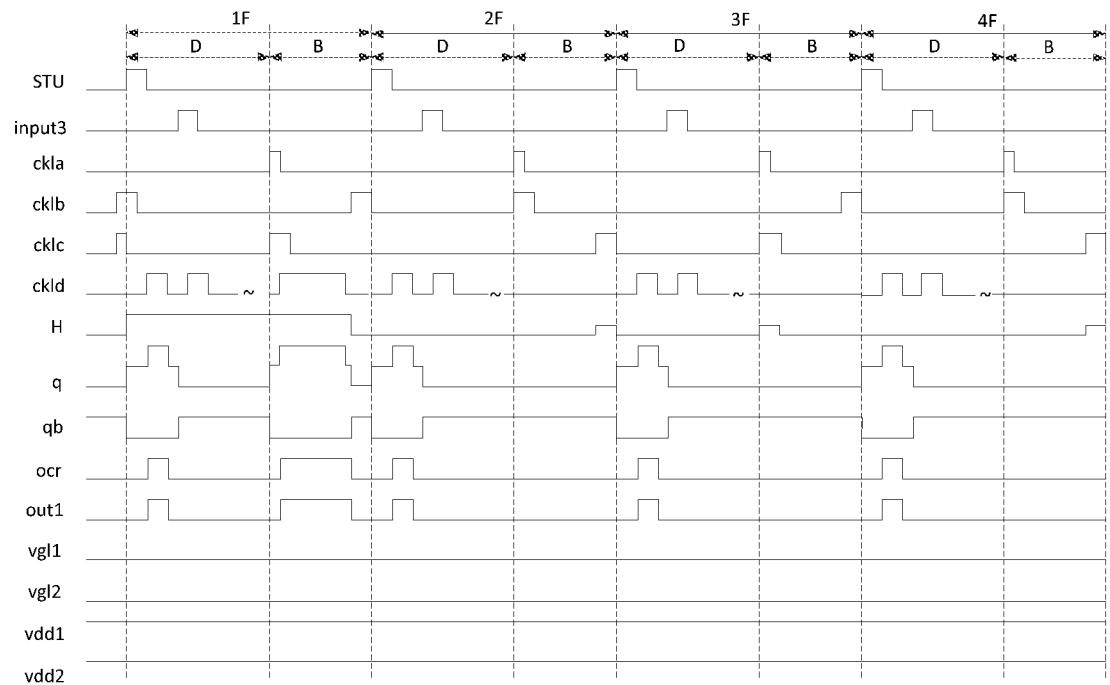
FIG. 2 is an operating timing diagram of a shift register unit according to an exemplary embodiment of the present disclosure.

In the following, the working process of the shift register unit in FIG. 1 is described in detail with reference to the operating timing diagram of the shift register unit as shown in FIG. 2. Taking an example where all the switching elements are N-type thin film transistors, ON signals of all the switching elements are at high level, and OFF signals of all the switching elements are at low level since all the switching elements are N-type thin film transistors. The first input terminal INPUT1 and the second input terminal INPUT2 receive a drive signal STU, the third input terminal INPUT3 receives a third input signal input3, the first clock signal terminal CKLA receives a first clock signal ckla, the second clock signal terminal CKLB receives a second clock signal cklb, the third clock signal terminal CKLC receives a third clock signal cklc, the fourth clock signal terminal CKLD receives a fourth clock signal ckld, the first power signal terminal VGL1 receives a first power signal vgl1, and the first power signal vgl1 is a low level, the second power signal terminal VDD1 receives a second power signal vdd1, and the second power signal vdd1 is a high level, the third power signal terminal VDD2 receives a third power signal vdd2, and the third power signal vdd2 is a high level. The fourth power signal terminal VGL2 receives a fourth power signal vgl2, and the fourth power signal vgl2 is a low level. It is to be noted that the voltage of the first power signal vgl1 is lower than that of the fourth power signal vgl2. H represents a signal of the first terminal of the first storage capacitor C1, q represents a signal of the pull-up node Q, qb represents a signal of the pull-down node QB, ocr represents a signal of the output terminal OCR, and out1 represents a signal of the first signal output terminal OUT1.

A first display frame (1F) includes a display phase (D) and a black insertion phase (B). The display phase (D) and the black insertion phase (B) in the first display frame (1F) are described below.

In the display phase (D), first, the drive signal STU is at a high level, the third input signal input3 is at a low level, the first clock signal ckla is at a low level, the second clock signal cklb is at a high level, the third clock signal cklc is at a low level, and the fourth clock signal ckld is at a low level. The first switching element M1, the fifth switching element M5, and the fourteenth switching element M14 are turned on, and the drive signal STU is transmitted to the first terminal of the first storage capacitor C1 through the first switching element M1 to charge the first storage capacitor C1. At this moment, the signal H of the first terminal of the first storage capacitor C1 is at a high level. The second power signal vdd1 is transmitted to the pull-up node Q through the fifth switching element M5 to charge the second storage capacitor C2. The seventh switching element M7, the fifteenth switching element M15, and the sixteenth switching element M16 are turned on, such that the first power signal vgl1 is transmitted to the pull-down node QB to turn off the eighth switching element M8, the ninth switching element M9, the tenth switching element M10, and the eleventh switching element M11. The fourth clock signal ckld is transmitted to the output terminal OCR and the first signal output terminal OUT1 through the fifteenth switching element M15 and the sixteenth switching element M16. Since the fourth clock signal ckld is at a low level at this moment, the signal ocr of the output terminal OCR and the signal out1 of the first signal output terminal OUT1 are at low level. At this moment, the signal q of the pull-up node Q is at a high level. Next, the second clock signal cklb is at a low level, the first switching element M1 and the fourteenth switching element M14 are turned off. The first terminal of the first storage capacitor C1 is still at a high level under the action of a signal stored therein. Since the drive signal STU is still at a high level and the fourth clock signal ckld is still at a low level, the signal ocr of the output terminal OCR and the signal out1 of the first signal output terminal OUT1 are still at low level. Next, the drive signal STU is at a low level, the fourth clock signal ckld is at a high level, the fifth switching element M5 is turned off, the signal q of the pull-up node Q is still at a high level under the action of a signal stored in the second storage capacitor C2, and the fifteenth switching element M15 and the sixteenth switching element M16 are still turned on. Since the fourth clock signal ckld is at a high level at this moment, both the signal ocr of the output terminal OCR and the signal out1 of the first signal output terminal OUT1 are at high level. Since the signal ocr of the output terminal OCR is at a high level, under the bootstrap action of the second storage capacitor C2, the signal q of the pull-up node Q is added with a high level on the basis of the original high level, that is, the signal q of the pull-up node Q is the original high level plus the high level of the output terminal OCR. Next, the fourth clock signal ckld is at a low level, under the bootstrap action of the second storage capacitor C2, the signal of the pull-up node Q becomes the original high level. At this moment, both the fifteenth switching element M15 and the sixteenth switching element M16 are turned on, and thus the signal ocr of the output terminal OCR is the fourth clock signal ckld, i.e., the low level. Next, the third input signal input3 is at a high level, both the twelfth switching element M12 and the thirteenth switching element M13 are turned on, and the first power signal vgl1 is transmitted to the pull-up node Q through the twelfth switching element M12 and the thirteenth switching element M13 to reset the pull-up node Q, such that the signal q of the pull-up node Q becomes a low level. At the same time, the third power signal vdd2 is transmitted to the pull-down node QB through the sixth switching element M6, such that the signal qb of the pull-down node QB becomes a high level, and the eighth switching element M8, the ninth switching element M9, the tenth switching element M10, and the eleventh switching element M11 are turned on. The first power signal vgl1 is transmitted to the pull-up node Q and the output terminal OCR through the eighth switching element M8, the nine switching elements M9 and the tenth switching element M10 to continuously denoise the pull-up node Q and the output terminal OCR. The fourth power signal vgl2 is transmitted to the first signal output terminal OUT1 through the eleventh switching element M11 to continuously denoise the first signal output terminal OUT1. Since both the first power signal vgl1 and the fourth power signal vgl2 are at low level, the signal ocr of the output terminal OCR and the signal out1 of the first signal output terminal OUT1 is at a low level. Next, the third input signal input3 is at a low level, and both the twelfth switching element M12 and the thirteenth switching element M13 are turned off. The third power signal vdd2 is transmitted to the pull-down node QB through the sixth switching element M6 at this moment and thus, the signal q of the pull-up node Q is still at a low level, and both the signal ocr of the output terminal OCR and the signal out1 of the first signal output terminal OUT1 are at low level.

It is to be noted that in the above display phase (D), both the third switching element M3 and the fourth switching element M4 are always in an OFF state, such that the impact of the voltage stored in the first storage capacitor C1 in the detection input circuit 101 on the entire display phase (D) is isolated. Meanwhile, since a rising edge and a falling edge of the output terminal OCR share a fifteenth switching element M15, the rising edge and the falling edge of the first signal output terminal OUT1 share a sixteenth switching element M16, and thus, the layout area is reduced.

In the black insertion phase (B), first, the first clock signal ckla is at a high level, the third clock signal cklc is at a high level, both the third switching element M3 and the fourth switching element M4 are turned on under the action of the first clock signal ckla, and the second switching element M2 is turned on under the action of a signal stored in the first storage capacitor C1, such that the third clock signal cklc is transmitted to the pull-up node Q through the second switching element M2, the third switching element M3 and the fourth switching element M4 to charge the first terminal of the second storage capacitor C2, the signal q of the pull-up node Q is at a high level, the seventh switching element M7 is turned on under the action of the signal q of the pull-up node Q. The first power signal vgl1 is transmitted to the pull-down node QB, such that the signal of the pull-down node QB is at a low level, and both the eighth switching element M8 and the ninth switching element M9 are turned off under the action of the signal qb of the pull-down node QB. In the meantime, the fifteenth switching element M15 and the sixteenth switching element M16 are turned on under the action of the signal q of the pull-up node Q, such that the fourth clock signal ckld is transmitted to the output terminal OCR and the first signal output terminal OUT1 through the fifteenth switching element M15 and the sixteenth switching element M16. Because at this moment the fourth clock signal ckld is at a low level, the signal ocr of the output terminal OCR and the signal out1 of the first signal output terminal OUT1 are both at a low level. Next, the first clock signal ckla is at a low level, the fourth clock signal ckld is at a high level, and both the third switching element M3 and the fourth switching element M4 are turned off, such that the third clock signal cklc cannot be transmitted to the pull-up node Q. Furthermore, the signal q of the pull-up node Q is at a high level under the action of the signal stored in the second storage capacitor C2, and both the fifteenth switching element M15 and the sixteenth switching element M16 are turned on. Since the fourth clock signal ckld is at a high level at this moment, the signal ocr of the output terminal OCR and the signal out1 of the first signal output terminal OUT1 are both at a high level. When the signal ocr of the output terminal OCR and the signal out1 of the first signal output terminal OUT1 are both at a high level, a high level is added for the signal q of the pull-up node Q on the basis of the original high level under the bootstrap action of the second storage capacitor C2. That is, the signal q of the pull-up node Q is the original high level plus the high level of the output terminal. Next, the fourth clock signal ckld is at a low level, and the signal ocr of the output terminal OCR and the signal out1 of the first signal output terminal OUT1 are both at a low level. At this moment, the pull-up node Q is back into the original high level under the bootstrap action of the second storage capacitor C2. Next, the signal of the second clock signal cklb is at a high level, and the first switching element M1 and the fourteenth switching element M14 are turned on under the action of the second clock signal cklb, such that the drive signal STU is transmitted to the first terminal of the first storage capacitor C1 through the first switching element M1. Because the drive signal STU is at a low level, the first terminal of the first storage capacitor C1 is reset by the drive signal STU. In the meantime, the first power signal vgl1 is transmitted to the pull-up node Q through the fourteenth switching element M14 to reset the pull-up node Q, such that the signal q of the pull node Q is at a low level. At this moment, the third power signal vdd2 is transmitted to the pull-down node QB through the sixth switching element M6, such that the signal qb of the pull-down node QB is at a high level. The eighth switching element M8, the ninth switching element M9, the tenth switching element M10, and the eleventh switching element M11 are turned on under the action of the signal qb of the pull-down node QB, such that the first power signal vgl1 is transmitted to the pull-up node Q and the output terminal OCR through the eighth switching element M8, the ninth switching element M9 and the tenth switching element M10 to continuously denoise the pull-up node Q and the output terminal OCR. Meanwhile, the fourth power signal vgl2 is transmitted to the first signal output terminal OUT1 through the eleventh switching element M11 to continuously denoise the first signal output terminal OUT1. The first power signal vgl1 and the fourth power signal vgl2 are both at a low level and thus, at this moment the signal ocr of the output terminal OCR and the signal out1 of the first signal output terminal OUT1 are both at a low level.

A second display frame (2F) includes a display phase (D) and a black insertion phase (B). The display phase (D) and the black insertion phase (B) in the second display frame (2F) are described below.

In the display phase (D), first, the drive signal STU is at a high level, the third input signal input3 is at a low level, the first clock signal ckla is at a low level, the second clock signal cklb is at a low level, the third clock signal cklc is at a low level, and the fourth clock signal ckld is at a low level. The fifth switching element M5 is turned on under the action of the drive signal STU, and the second power signal vdd1 is transmitted to the pull-up node Q to charge the second storage capacitor C2, such that the signal q of the pull-up node Q is at a high level. The seventh switching element M7 is turned on under the action of the signal q of the pull-up node Q to transmit the first power signal vgl1 to the pull-down node QB, and the eighth switching element M8, the ninth switching element M9, the tenth switching element M10, and the eleventh switching element M11 are turned off under the action of the signal qb of the pull-down node QB. In the meantime, both the fifteenth switching element M15 and the sixteenth switching element M16 are turned on under the action of the signal q of the pull-up node Q, and the fourth clock signal ckld is transmitted to the output terminal OCR and the first signal output terminal OUT1. At this moment, the fourth clock signal ckld is at a low level, and thus, the signal ocr of the output terminal OCR and the signal out1 of the first signal output terminal OUT1 are both at a low level. Next, the drive signal STU is at a low level, the fifth switching element M5 is turned off. Since the fourth clock signal ckld is at a high level, the signal ocr of the output terminal OCR and the signal out1 of the first signal output terminal OUT1 are both at a high level. At this moment, a high level is added for the signal q of the pull-up node Q on the basis of the original high level under the bootstrap action of the second storage capacitor C2. That is, the signal q of the pull-up node Q is the original high level plus the high level of the output terminal. Next, the fourth clock signal ckld is at a low level, and the signal ocr of the output terminal OCR and the signal out1 of the first signal output terminal OUT1 are both at a low level. At this moment, the signal of the pull-up node Q is back into the original high level under the bootstrap action of the second storage capacitor C2. Next, the third input signal input3 is changed into a high level, the twelfth switching element M12 and the thirteenth switching element M13 are turned on, and the first power signal vgl1 is transmitted to the pull-up node Q to reset the pull-up node Q. In the meantime, the third power signal vdd2 is transmitted to the pull-down node QB through the sixth switching element M6, and the eighth switching element M8, the ninth switching element M9, the tenth switching element M10, and the eleventh switching element M11 are turned on, such that the first power signal vgl1 is transmitted to the pull-up node Q and the output terminal OCR through the eighth switching element M8, the ninth switching element M9 and the tenth switching element M10 to continuously denoise the pull-up node Q and the output terminal OCR. Meanwhile, the fourth power signal vgl2 is transmitted to the first signal output terminal OUT1 through the eleventh switching element M11 to continuously denoise the first signal output terminal OUT1. Since the first power signal vgl1 and the fourth power signal vgl2 are both at a low level, the signal ocr of the output terminal OCR and the signal out1 of the first signal output terminal OUT1 are both at a low level. Next, the third input signal input3 is at a low level, and both the twelfth switching element M12 and the thirteenth switching element M13 are turned off. At this moment, the third power signal vdd2 is transmitted to the pull-down node QB through the sixth switching element M6, and thus, the signal q of the pull-up node Q is still at a low level, and the signal ocr of the output terminal OCR and the signal out1 of the first signal output terminal OUT1 are both at a low level.

In the black insertion phase (B), first, the first clock signal ckla is at a high level, the second clock signal cklb is at a high level, both the third switching element M3 and the fourth switching element M4 are turned on under the action of the first clock signal ckla, the first switching element M1 is turned on under the action of the second clock signal cklb, and the drive signal STU is transmitted to the first terminal of the first storage capacitor C1. Since the drive signal STU is at a low level, the second switching element M2 is in an OFF state. In this case, the signal ocr of the output terminal OCR is the first power signal vgl1, and the signal out1 of the first signal output terminal OUT1 is the fourth power signal vgl2.

A third display frame (3F) includes a display phase (D) and a black insertion phase (B). The display phase (D) and the black insertion phase (B) in the third display frame (3F) are described below.

In the display phase (D), first, the drive signal STU is at a high level, the third clock signal cklc is at a low level, and the fifth switching element M5 is turned on under the action of the drive signal STU, such that the second power signal vdd1 is transmitted to the pull-up node Q to charge the second storage capacitor C2. The seventh switching element M7 is turned on under the action of the signal q of the pull-up node Q, the first power signal vgl1 is transmitted to the pull-down node QB through the seventh switching element M7, and the eighth switching element M8, the ninth switching element M9, the tenth switching element M10, and the eleventh switching element M11 are turned off under the action of the signal qb of the pull-down node QB. In the meantime, both the fifteenth switching element M15 and the sixteenth switching element M16 are turned on under the action of the signal q of the pull-up node Q, such that the fourth clock signal ckld is transmitted to the output terminal OCR and the first signal output terminal OUT1 through the fifteenth switching element M15 and the sixteenth switching element M16, respectively. At this moment, the fourth clock signal ckld is at a low level, and thus, the signal ocr of the output terminal OCR and the signal out1 of the first signal output terminal OUT1 are both at a low level. Next, the fourth clock signal ckld is at a high level, the signal ocr of the output terminal OCR and the signal out1 of the first signal output terminal OUT1 are both at a high level. Meanwhile, a high level of the fourth clock signal ckld is added for the signal q of the pull-up node Q on the basis of the original high level under the bootstrap action of the second storage capacitor C2. Next, the fourth clock signal ckld is at a low level, the signal ocr of the output terminal OCR and the signal out1 of the first signal output terminal OUT1 are both at a low level. At this moment, the signal q of the pull-up node Q is back into the original high level under the bootstrap action of the second storage capacitor C2. Next, the third input signal input3 is at a high level, the twelfth switching element M12 and the thirteenth switching element M13 are turned on, and the first power signal vgl1 is transmitted to the pull-up node Q to reset the pull-up node Q. In the meantime, the third power signal vdd2 is transmitted to the pull-down node QB through the sixth switching element M6, and the eighth switching element M8, the ninth switching element M9, the tenth switching element M10, and the eleventh switching element M11 are turned on under the action of the signal qb of the pull-down node QB, such that the first power signal vgl1 is transmitted to the pull-up node Q and the output terminal OCR through the eighth switching element M8, the ninth switching element M9, and the tenth switching element M10 to continuously denoise the pull-up node Q and the output terminal OCR. Meanwhile, the fourth power signal vgl2 is transmitted to the first signal output terminal OUT1 through the eleventh switching element M11 to continuously denoise the first signal output terminal OUT1. Next, the third input signal input3 is at a low level, and both the twelfth switching element M12 and the thirteenth switching element M13 are turned off. At this moment, the third power signal vdd2 is transmitted to the pull-down node QB through the sixth switching element M6, and thus, the signal q of the pull-up node Q is still at a low level, and the signal ocr of the output terminal OCR and the signal out1 of the first signal output terminal OUT1 are both at a low level.

In the black insertion phase (B), first, the first clock signal ckla is at a high level, the third clock signal cklb is at a high level, and both the third switching element M3 and the fourth switching element M4 are turned on under the action of the first clock signal ckla. However, the second switching element M2 is turned off at this moment, and thus, the third clock signal cklc cannot be transmitted to the pull-up node Q. The signal ocr of the output terminal OCR and the signal out1 of the first signal output terminal OUT1 are both at a low level. Next, the first clock signal ckla is at a low level, the second clock signal cklb is at a high level, and the third clock signal cklc is at a low level. Both the third switching element M3 and the fourth switching element M4 are turned off under the action of the first clock signal ckla, and both the first switching element M1 and the fourteenth switching element M14 are turned on under the action of the second clock signal cklb, such that the first power signal vgl1 is transmitted to the pull-up node Q through the fourteenth switching element M14 to reset the pull-up node Q. The first switching element M1 is turned on under the action of the second clock signal cklb, such that the drive signal STU is transmitted to the first terminal of the first storage capacitor C1. Because the drive signal STU is at a low level, the second switching element M2 is turned off. At this moment, the signal ocr of the output terminal OCR and the signal out1 of the first signal output terminal OUT1 are both at a low level.

A fourth display frame (4F) includes a display phase (D) and a black insertion phase (B). The display phase (D) and the black insertion phase (B) in the fourth display frame (4F) are described below.

In the display phase (D), first, the drive signal STU is at a high level, the third input signal input3 is at a low level, the first clock signal ckla is at a low level, the second clock signal cklb is at a low level, the third clock signal cklc is at a low level, and the fourth clock signal ckld is at a low level. The fifth switching element M5 is turned on under the action of the drive signal STU, and the second power signal vdd1 is transmitted to the pull-up node Q to charge the second storage capacitor C2, such that the signal of the pull-up node Q is changed into a high level. The seventh switching element M7 is turned on under the action of the signal q of the pull-up node Q to transmit the first power signal vgl1 to the pull-down node QB, and the eighth switching element M8, the ninth switching element M9, the tenth switching element M10, and the eleventh switching element M11 are turned off under the action of the signal qb of the pull-down node QB. In the meantime, both the fifteenth switching element M15 and the sixteenth switching element M16 are turned on under the action of the signal q of the pull-up node Q, and the fourth clock signal ckld is transmitted to the output terminal OCR and the first signal output terminal OUT1. At this moment, the fourth clock signal ckld is at a low level, and thus, the signal ocr of the output terminal OCR and the signal out1 of the first signal output terminal OUT1 are both at a low level. Next, the drive signal STU is at a low level, the fourth clock signal ckld is at a high level, and the signal ocr of the output terminal OCR and the signal out1 of the first signal output terminal OUT1 are both at a high level. At this moment, a high level is added for the signal q of the pull-up node Q on the basis of the original high level under the bootstrap action of the second storage capacitor C2. Next, the fourth clock signal ckld is changed into a low level, and the signal ocr of the output terminal OCR and the signal out1 of the first signal output terminal OUT1 are both at a low level. At this moment, the signal q of the pull-up node Q is back into the original high level under the bootstrap action of the second storage capacitor C2. Next, the third input signal input3 is at a high level, both the twelfth switching element M12 and the thirteenth switching element M13 are turned on, and the first power signal vgl1 is transmitted to the pull-up node Q to reset the pull-up node Q. In the meantime, the third power signal vdd2 is transmitted to the pull-down node QB through the sixth switching element M6, and the eighth switching element M8, the ninth switching element M9, the tenth switching element M10, and the eleventh switching element M11 are turned on, such that the first power signal vgl1 is transmitted to the pull-up node Q and the output terminal OCR through the eighth switching element M8, the ninth switching element M9, and the tenth switching element M10 to continuously denoise the pull-up node Q and the output terminal OCR. Meanwhile, the fourth power signal vgl2 is transmitted to the first signal output terminal OUT1 through the eleventh switching element M11 to continuously denoise the first signal output terminal OUT1. Since the first power signal vgl1 and the fourth power signal vgl2 are both at a low level, the signal ocr of the output terminal OCR and the signal out1 of the first signal output terminal OUT1 are both at a low level. Next, the third input signal input3 is at a low level, and both the twelfth switching element M12 and the thirteenth switching element M13 are turned off. At this moment, the signal qb of the pull-down node QB is at a high level, and the signal q of the pull-up node Q is at a low level. Therefore, the signal ocr of the output terminal OCR and the signal out1 of the first signal output terminal OUT1 are both at a low level.

In the black insertion phase (B), first, the first clock signal ckla is at a high level, the second clock signal cklb is at a high level, both the third switching element M3 and the fourth switching element M4 are turned on under the action of the first clock signal ckla, the first switching element M1 is turned on under the action of the second clock signal cklb, and the drive signal STU is transmitted to the first terminal of the first storage capacitor C1. Since the drive signal STU is at a low level, the second switching element M2 is in an OFF state. In this case, the signal q of the pull-up node Q is still at a low level, thus the signal ocr of the output terminal OCR is the first power signal vgl1, and the signal out1 of the first signal output terminal OUT1 is the fourth power signal vgl4.

As can be seen from the above, during the working process of the shift register unit, the display input circuit 102 and the detection input circuit 101 share the inverter circuit 103, the pull-down circuit 104, the reset circuit 105, and the first output circuit 106, which greatly simplifies the circuit structure of the shift register unit, in addition to greatly reducing signal lines, and thus, greatly reduces the area of the shift register circuit. Therefore, the requirements for high resolution and narrow bezel in a display device may be satisfied.

Figure 3:
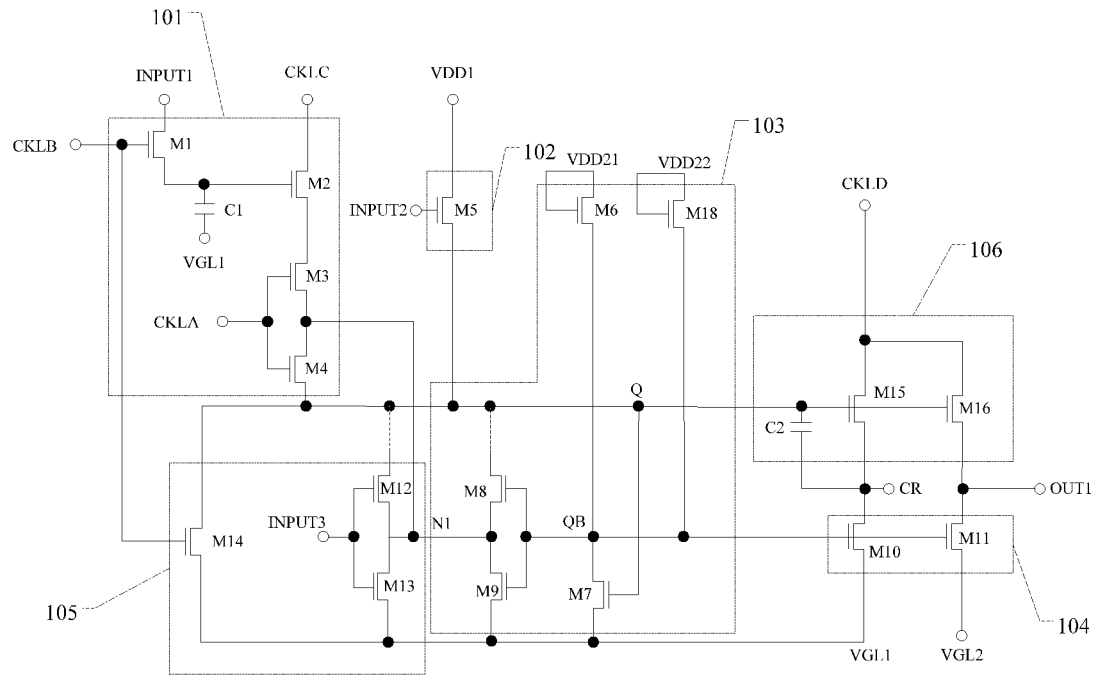
FIG. 3 is a structural schematic diagram II of a shift register unit according to an exemplary embodiment of the present disclosure.

In addition, in order to prolong the service life of the shift register unit, the third power signal terminal may include a first power subsignal terminal and a second power subsignal terminal. On this basis, on the basis of FIG. 1, as shown in FIG. 3, the inverter circuit 103 is coupled to the first power subsignal terminal VDD21, the second power subsignal terminal VDD22, the pull-up node Q, the pull-down node QB, the first node N1, and the first power signal terminal VGL1, and is configured to alternately transmit a signal from the first power subsignal terminal VDD21 and a signal from the second power subsignal terminal VDD22 to the pull-down node QB in alternate response to the signal from the first power subsignal terminal VDD21 and the signal from the second power subsignal terminal VDD22, transmit the signal from the first power signal terminal VGL1 to the pull-down node QB in response to the signal from the pull-up node Q, and transmit the signal from the first power signal terminal VGL1 to the pull-up node Q in response to the signal from the pull-down node QB. The signal from the first power subsignal terminal VDD21 and the signal from the second power subsignal terminal VDD22 are reverse signals with same frequency.

The specific structure and the connection of the inverter circuit are described in detail below with reference to FIG. 3.

The inverter circuit 103 may include:

a sixth switching element M6, a control terminal, and a first terminal of the sixth switching element M6 being coupled to the first power subsignal terminal VDD21, and a second terminal of the sixth switching element M6 being coupled to the pull-down node QB;

a seventh switching element M7, a control terminal of the seventh switching element M7 being coupled to the pull-up node Q, a first terminal of the seventh switching element M7 being coupled to the pull-down node QB, and a second terminal of the seventh switching element M7 being coupled to the first power signal terminal VGL1;

an eighth switching element M8, a control terminal of the eighth switching element M8 being coupled to the pull-down node QB, and a first terminal of the eighth switching element M8 being coupled to the pull-up node Q;

a ninth switching element M9, a control terminal of the ninth switching element M9 being coupled to the pull-down node QB, a first terminal of the ninth switching element M9 being coupled to the second terminal of the eighth switching element M8, and a second terminal of the ninth switching element M9 being coupled to the first power signal terminal VGL1; and an eighteenth switching element M18, a control terminal and a first terminal of the eighteenth switching element M18 being coupled to the second power subsignal terminal VDD22, and a second terminal of the eighteenth switching element M18 being coupled to the pull-down node QB.

In this exemplary embodiment, the sixth switching element to the ninth switching element (M6 to M9) and the eighteenth switching element M18 may respectively correspond to a sixth switching transistor to a ninth switching transistor and an eighteenth switching transistor, and each of the switching transistors has a control terminal, a first terminal, and a second terminal. Specifically, the control terminal of each switching transistor may be a gate, the first terminal thereof may be a source, and the second terminal thereof may be a drain. Alternatively, the control terminal of each switching transistor may be a gate, the first terminal thereof may be a drain, and the second terminal thereof may be a source. In addition, each of the switching transistors may be an enhancement transistor or a depletion transistor, which is not particularly limited by this exemplary embodiment. In addition, each of the switching transistors may be an N-type transistor or a P-type transistor, which is not particularly limited by this exemplary embodiment.

The signal from the first power subsignal terminal VDD21 and the signal from the second power subsignal terminal VDD22 are reverse signals with the same frequency. That is, when the signal from the first power subsignal terminal VDD21 is at a high level, the signal from the second power subsignal terminal VDD22 is at a low level; and when the signal from the first power subsignal terminal VDD21 is at a low level, the signal from the second power subsignal terminal VDD22 is at a high level.

It is to be noted that either the first power subsignal terminal VDD21 or the second power subsignal terminal VDD22 in FIG. 3 works, and the shift register unit in FIG. 3 has the same working principle as the shift register unit in FIG. 1, thus, the working processes of the shift register unit in FIG. 3 are not again being described here.

When the pull-up node Q is at an On level (i.e., when the switching element is an N-type thin film transistor, the On level is a high level; when the switching element is a P-type thin film transistor, the On level is a low level), in order to prevent the signal of the pull-up node Q from electric leakage, a feedback circuit may be provided, and the feedback circuit may include the following two connection modes.

Figure 4:
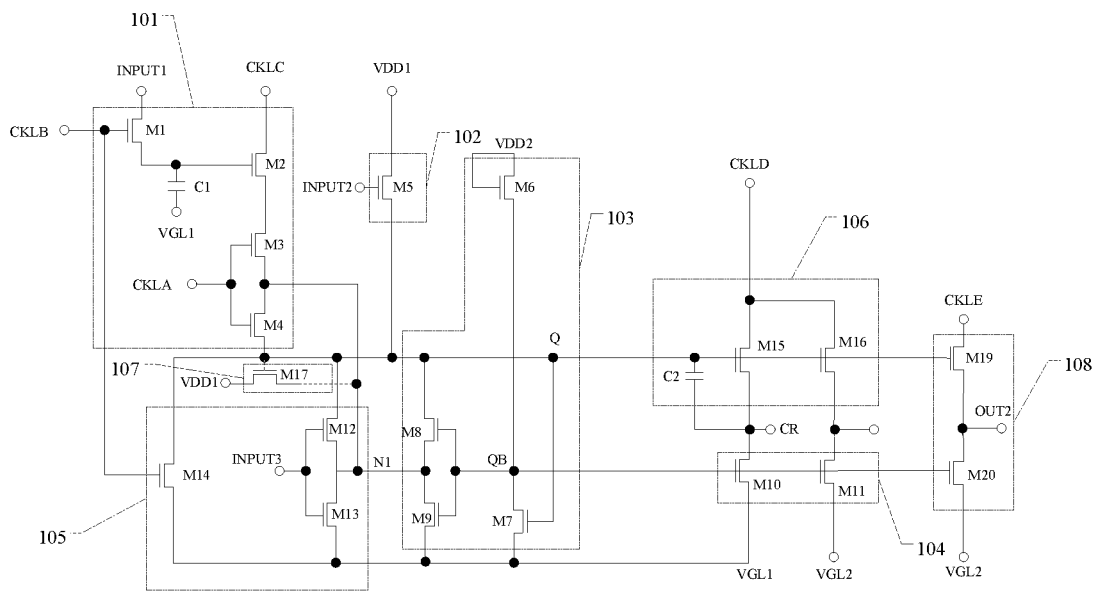
FIG. 4 is a structural schematic diagram III of a shift register unit according to an exemplary embodiment of the present disclosure.

In the first connection mode, on the basis of FIG. 1, as shown in FIG. 4, the feedback circuit 107 is coupled to the pull-up node Q, the first node N1 and the second power signal terminal VDD1, and is configured to communicate the second power signal terminal VDD1 with the first node N1 in response to the signal of the pull-up node Q.

The specific structure and the connection mode of the feedback circuit 107 are described below with reference to FIG. 4.

The feedback circuit 107 may include:

a seventeenth switching element M17, a control terminal of the seventeenth switching element M17 being coupled to the pull-up node Q, a first terminal of the seventeenth switching element M17 being coupled to the second power signal terminal VDD1, and a second terminal of the seventeenth switching element M17 being coupled to the first node N1.

In this exemplary embodiment, the seventeenth switching element M17 may correspond to a seventeenth switching transistor, and the seventeenth switching transistor has a control terminal, a first terminal, and a second terminal. Specifically, the control terminal of the seventeenth switching transistor may be a gate, the first terminal thereof may be a source, and the second terminal thereof may be a drain. Alternatively, the control terminal of the seventeenth switching transistor may be a gate, the first terminal thereof may be a drain, and the second terminal thereof may be a source. In addition, the seventeenth switching transistor may be an enhancement transistor or a depletion transistor, which is not particularly limited in this exemplary embodiment. In addition, the seventeenth switching transistor may be an N-type transistor or a P-type transistor, which is not particularly limited in this exemplary embodiment.

The working process of the feedback circuit 107 is described below with reference to FIG. 4 by taking an example in which all the switching elements are N-type thin film transistors. The switching elements are the N-type thin film transistors. Therefore, when the pull-up node Q is at a high level, the seventeenth switching element M17 is turned on under the action of the signal of the pull-up node Q, and the signal of the second clock signal terminal VDD1 is transmitted to the first terminal of the fourth switching element M4, the second terminal of the eighth switching element M8, and the second terminal of the twelfth switching element M12, such that the first terminal of the fourth switching element M4, the second terminal of the eighth switching element M8 and the second terminal of the twelfth switching element M12 are at a high level. At this moment, the second terminal of the fourth switching element M4, the first terminal of the eighth switching element M8 and the first terminal of the twelfth switching element M12 are at a high level. Therefore, when the pull-up node Q is at a high level, the voltages between the first terminals and the second terminals of the fourth switching element M4, the eighth switching element M8 and the twelfth switching element M12 are the same. Therefore, electric leakage of the signal of the pull-up node Q may be prevented along the switching elements (i.e., the fourth switching element M4, the eighth switching element M8, and the twelfth switching element M12) whose control terminals are coupled to the pull-up node Q, such that it is ensured that the output terminal OCR and the first signal output terminal OUT2 output correct signals.

Figure 5:
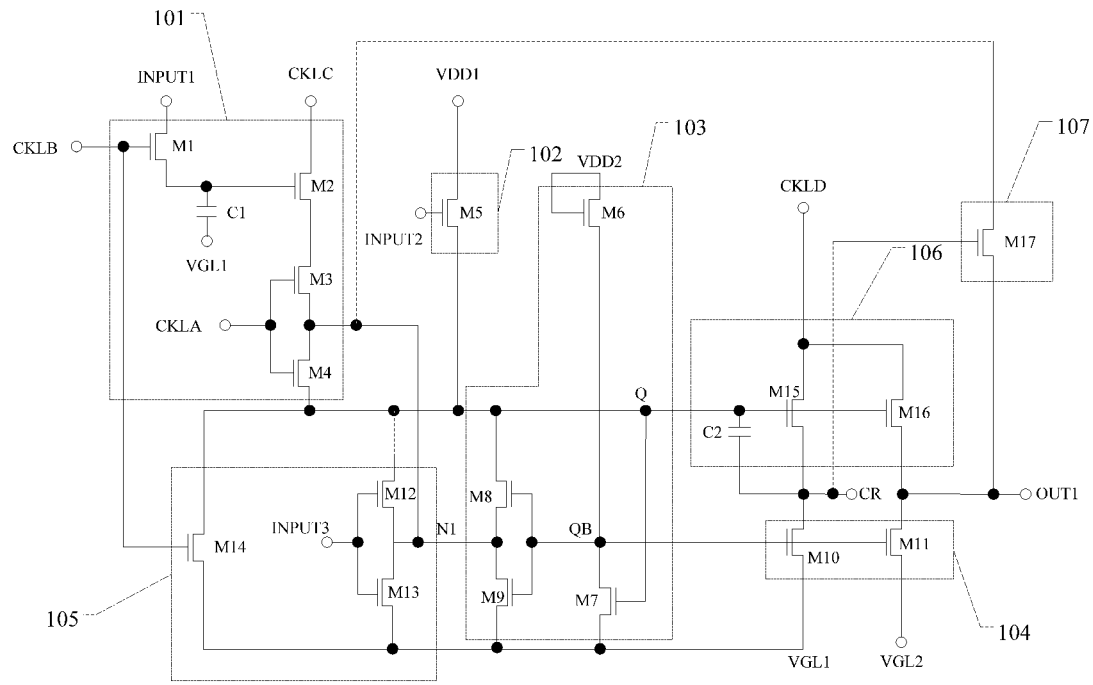
FIG. 5 is a structural schematic diagram IV of a shift register unit according to an exemplary embodiment of the present disclosure.

In the second connection mode, on the basis of FIG. 1, as shown in FIG. 5, the shift register unit may further include a feedback circuit 107, which is coupled to the output terminal OCR, the first signal output terminal OUT1 and the first node N1, and is configured to communicate the first signal output terminal OUT1 with the first node N1 in response to the signal of the output terminal OCR.

The specific structure and the connection of the feedback circuit are described below with reference to FIG. 5.

The feedback circuit 107 may include:

a seventeenth switching element M17, a control terminal of the seventeenth switching element M17 being coupled to the output terminal OCR, a first terminal of the seventeenth switching element M17 being coupled to the first node N1, and a second terminal of the seventeenth switching element M17 being coupled to the first signal output terminal OUT1.

In this exemplary embodiment, the seventeenth switching element M17 may correspond to a seventeenth switching transistor, and the seventeenth switching transistor has a control terminal, a first terminal, and a second terminal. Specifically, the control terminal of the seventeenth switching transistor may be a gate, the first terminal thereof may be a source, and the second terminal thereof may be a drain. Alternatively, the control terminal of the seventeenth switching transistor may be the gate, the first terminal thereof may be the drain, and the second terminal thereof may be the source. In addition, the seventeenth switching transistor may be an enhancement transistor or a depletion transistor, which is not particularly limited in this exemplary embodiment. In addition, the seventeenth switching transistor may be an N-type transistor or a P-type transistor, which is not particularly limited in this exemplary embodiment.

The working process of the feedback circuit 107 is described below with reference to FIG. 5 by taking an example in which all the switching elements are N-type thin film transistors. The switching elements are the N-type thin film transistors. Therefore, when the pull-up node Q is at a high level and the signal of the output terminal OCR and the signal of the first signal output terminal OUT1 are both at a high level, the seventeenth switching element M17 is turned on under the action of the signal of the output terminal OCR, and the signal of the first signal output terminal OUT1 is transmitted to the first terminal of the fourth switching element M4, the second terminal of the eighth switching element M8 and the second terminal of the twelfth switching element M12, such that the first terminal of the fourth switching element M4, the second terminal of the eighth switching element M8 and the second terminal of the twelfth switching element M12 are at a high level. At this moment, the second terminal of the fourth switching element M4, the first terminal of the eighth switching element M8 and the first terminal of the twelfth switching element M12 are at a high level. As can be seen from above, when the pull-up node Q is at a high level and the signal of the output terminal OCR and the signal of the first signal output terminal OUT1 are both at a high level, the voltages between the first terminals and the second terminals of the fourth switching element M4, the eighth switching element M8 and the twelfth switching element M12 are the same. Therefore, electric leakage of the signal of the pull-up node Q may be prevented along the switching elements (i.e., the fourth switching element M4, the eighth switching element M8, and the twelfth switching element M12) whose control terminals are coupled to the pull-up node Q, such that it is ensured that the output terminal OCR and the first signal output terminal OUT2 output correct signals.

In order to avoid the electric leakage of the signal stored in the detection input circuit, and to ensure the normal operation of the detection process (i.e., the black insertion phase) of the shift register unit, the shift register unit may further include:

a current detection subcircuit coupled to the first input terminal, and configured to detect a signal from the first input terminal; and a signal generation subcircuit coupled to the current detection subcircuit and the second clock signal terminal, and configured to generate an off signal according to the signal from the first input terminal detected by the current detection subcircuit and transmit the off signal to the second clock signal terminal.

In this exemplary embodiment, the current detection subcircuit detects a current signal of the first input terminal in real time, determines whether electric leakage occurs in the first switching element according to the detected current signal of the first input terminal, calculates a leakage current of the first switching element when the electric leakage occurs in the first switching element, and transmits the leakage current of the first switching element to the signal generation subcircuit. The signal generation subcircuit generates an OFF signal according to the leakage current of the first switching element, and transmits the OFF signal to the second clock signal terminal to turn off the first switching element and the eighth switching element. As can be seen from the above, whether electric leakage occurs in the first switching element may be detected in real time through the current detection subcircuit and the signal generation subcircuit, and the OFF signal is generated when the electric leakage occurs in the first switching element to turn off the first switching element and the eighth switching element. In addition, electric leakage of the signal stored from the detection input unit to a storage capacitor along the first switching element may be prevented. That is, electric leakage of the signal stored in the detection input circuit may be prevented, thereby ensuring proper operation in the detection process (i.e., the black insertion phase) of the shift register unit.

Figure 6:
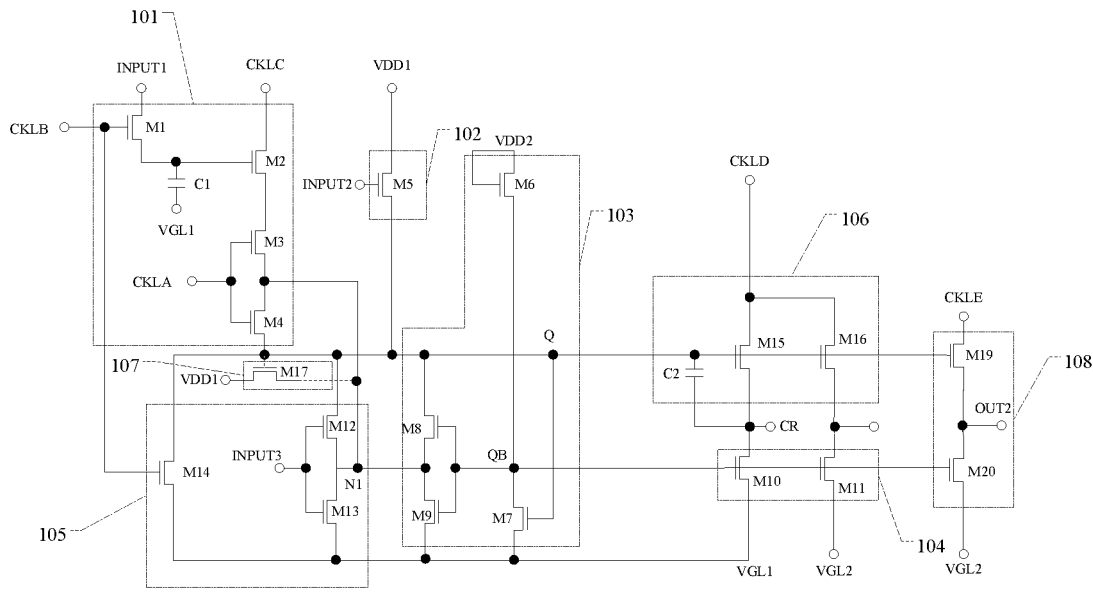
FIG. 6 is a structural schematic diagram V of a shift register unit according to an exemplary embodiment of the present disclosure.

In order to meet requirements of a plurality of output signals, on the basis of FIG. 1, as shown in FIG. 6, the shift register unit may further include:

a second output circuit 108 coupled to a fifth clock signal terminal CKLE, the pull-up node Q, the second signal output terminal OUT2, the pull-down node QB, and the fourth power signal terminal VGL2, and configured to transmit a signal from the fifth clock signal terminal CKLE to the second signal output terminal OUT2 in response to the signal from the pull-up node Q and transmit the signal from the fourth power signal terminal VGL2 to the second signal output terminal OUT2 in response to the signal from the pull-down node QB.

Specific structures and connection of the shift register unit are described below with reference to FIG. 6.

The second output circuit 108 may include:

a nineteenth switching element M19, a control terminal of the nineteenth switching element M19 being coupled to the pull-up node Q, a first terminal of the nineteenth switching element M19 being coupled to the fifth clock signal terminal CKLE, and a second terminal of the nineteenth switching element M19 being coupled to the second signal output terminal OUT2; and a twentieth switching element M20, a control terminal of the twentieth switching element M20 being coupled to the pull-down node QB, a first terminal of the twentieth switching element M20 being coupled to the second signal output terminal OUT2, and a second terminal of the twentieth switching element M20 being coupled to the fourth power signal terminal VGL2.

In this exemplary embodiment, the nineteenth switching element M19 and the twentieth switching element M20 may respectively correspond to a nineteenth switching transistor and a twentieth switching transistor, and each switching transistor has a control terminal, a first terminal, and a second terminal. Specifically, the control terminal of each switching transistor may be a gate, the first terminal thereof may be a source, and the second terminal thereof may be a drain. Alternatively, the control terminal of each switching transistor may be a gate, the first terminal thereof may be a drain, and the second terminal thereof may be a source. In addition, each of the switching transistors may be an enhancement transistor or a depletion transistor, which is not particularly limited by this exemplary embodiment. In addition, each of the switching transistors may be an N-type transistor or a P-type transistor, which is not particularly limited by this exemplary embodiment.

When the pull-up node Q is at an ON level and the pull-down node QB is at an OFF level, the second signal output terminal OUT2 outputs the signal of the fifth clock signal terminal CKLE. When the pull-up node Q is at an OFF level and the pull-down node QB is at an ON level, the second signal output terminal OUT2 outputs a signal of the fourth power signal terminal VGL2.

It is to be noted that in the above embodiments, all the switching elements are N-type thin film transistors. However, those skilled in the art may easily obtain a shift register unit in which all the switching elements are P-type thin film transistors according to the gate driving circuit provided by the present disclosure. Because all the switching elements are P-type thin film transistors, the ON signals of all the switching elements are at low level. The use of all P-type thin film transistor has the following advantages: strong in noise suppression; easy to implement charge management at a low level, simple in fabricating the P-type thin film transistor, lower in price, better in stability, and so forth.

Of course, the shift register unit provided by the present disclosure may be changed into a complementary metal oxide semiconductor (CMOS) circuit or the like, and is not limited to the gate driving circuit provided in this embodiment, and details thereof are omitted herein.

This exemplary embodiment provides a shift register circuit, which includes a plurality of the shift register units according to any one of the above embodiments.

A first clock signal terminal of the shift register unit in an $N^{th}$ row receives a first clock signal, and a first clock signal terminal of the shift register unit in an $(N+1)^{th}$ row receives the first clock signal.

A second clock signal terminal of the shift register unit in the $N^{th}$ row receives a second clock signal, and a third clock signal terminal of the shift register unit in the $N^{th}$ row receives a third clock signal.

A third clock signal terminal of the shift register unit in the $(N+1)^{th}$ row receives the second clock signal, and a second clock signal terminal of the shift register unit in the $(N+1)^{th}$ row receives the third clock signal.

An output terminal of the shift register unit in the $N^{th}$ row is respectively coupled to a first input terminal of the shift register unit in the $(N+1)^{th}$ row and a second input terminal of the shift register unit in the $(N+2)^{th}$ row.

An output terminal of the shift register unit in the $(N+1)^{th}$ row is respectively coupled to a first input terminal of the shift register unit in the $(N+2)^{th}$ row and a second input terminal of the shift register unit in the $(N+3)^{th}$ row.

A third input terminal of the shift register unit in the $N^{th}$ row is coupled to an output terminal of the shift register unit in the $(N+3)^{th}$ row.

A first input terminal and a second input terminal of the shift register unit in a first row and a second input terminal of the shift register unit in a second row receive a drive signal. The N is an odd number or an even number.

Figure 7:
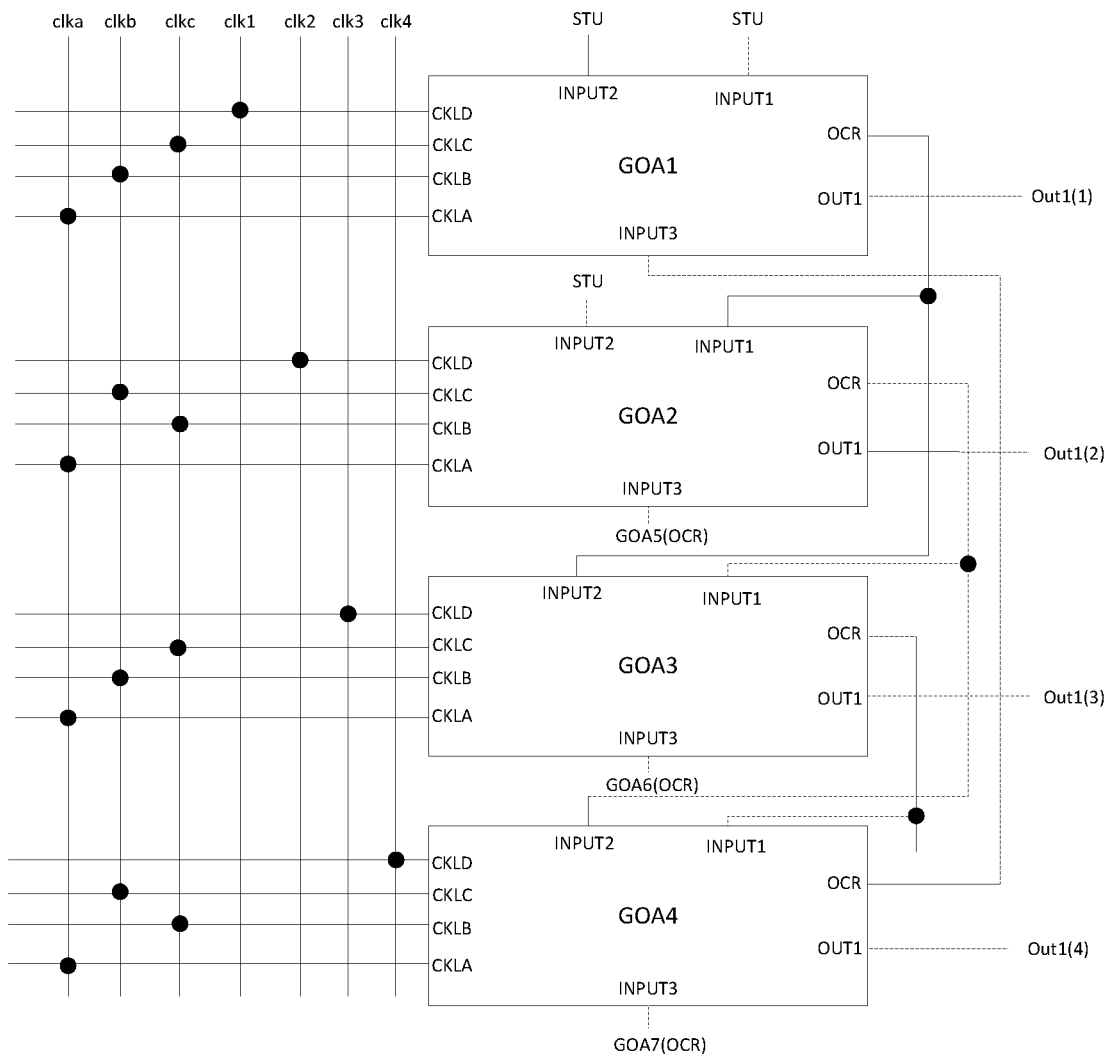
FIG. 7 is a schematic diagram of a shift register circuit according to an exemplary embodiment of the present disclosure.

In this exemplary embodiment, FIG. 7 illustrates a connection mode of the shift register units of the first four stages in the above shift register circuit. As can be seen from FIG. 7, the first clock signal terminals CKLA of the first stage shift register unit to the fourth stage shift register unit (GOA1 to GOA4) receive the first clock signal ckla, the second clock signal terminals CKLB of the first stage shift register unit and the third stage shift register unit (GOA1 and GOA3) receive the second clock signal cklb, the second clock signal terminals CKLB of the second stage shift register unit and the fourth stage shift register unit (GOA2 and GOA4) receive the third clock signal cklb, the third clock signal terminals CKLC of the first stage shift register unit and the third stage shift register unit (GOA1 and GOA3) receive the third clock signal cklc, the third clock signal terminals CKLC of the second stage shift register unit and the fourth stage shift register unit (GOA2 and GOA4) receive the second clock signal cklb, and the fourth clock signal terminals CKLD of the first stage shift register unit to the fourth stage shift register unit (GOA1 to GOA4) respectively receive the sixth clock signal to the ninth clock signal (ckl1~ckl4). That is, the fourth clock signal terminal CKLD of the first stage shift register unit GOA1 receives the sixth clock signal ckl1, the fourth clock signal terminal CKLD of the second stage shift register unit GOA2 receives the seventh clock signal ckl2, the fourth clock signal terminal CKLD of the third stage shift register unit GOA3 receives the eighth clock signal ckl3, and the fourth clock signal terminal CKLD of the fourth stage shift register unit GOA4 receives the ninth clock signal ckl4. The first power signal terminal VGL1 of each stage shift register unit receives the first power signal vgl1, the second power signal terminal VDD1 of each stage shift register unit receives the second power signal vdd1, the third power signal terminal VDD2 of each stage shift register unit receives the third power signal vdd2, and the fourth power signal terminal VGL2 of each stage shift register unit receives the fourth power signal vgl2. It is to be noted that starting from the fourth clock signal terminal CKLD of the fifth stage shift register, the sixth clock signal to the ninth clock signals ckl1 to ckl4 (not shown in FIG. 7) are repeatedly received in sequence. The first input terminal INPUT1 and the second input terminal INPUT2 of the first stage shift register unit GOA1 and the second input terminal INPUT2 of the second stage shift register unit GOA2 receive the drive signal STU. The output terminal OCR of first stage shift register unit GOA is coupled to the first input terminal INPUT1 of the second stage shift register unit GOA2 and the second input terminal INPUT2 of the third stage shift register unit GOA3. The output terminal OCR of the second stage shift register unit GOA2 is coupled to the first input terminal INPUT1 of the third stage shift register unit GOA3 and the second input terminal INPUT2 of the fourth stage shift register unit GOA4. The output terminal OCR of the third stage shift register unit GOA3 is coupled to the first input terminal INPUT of the fourth stage shift register unit GOA4 and the second input terminal of the fifth stage shift register unit (not shown in the figure).

Figure 8:
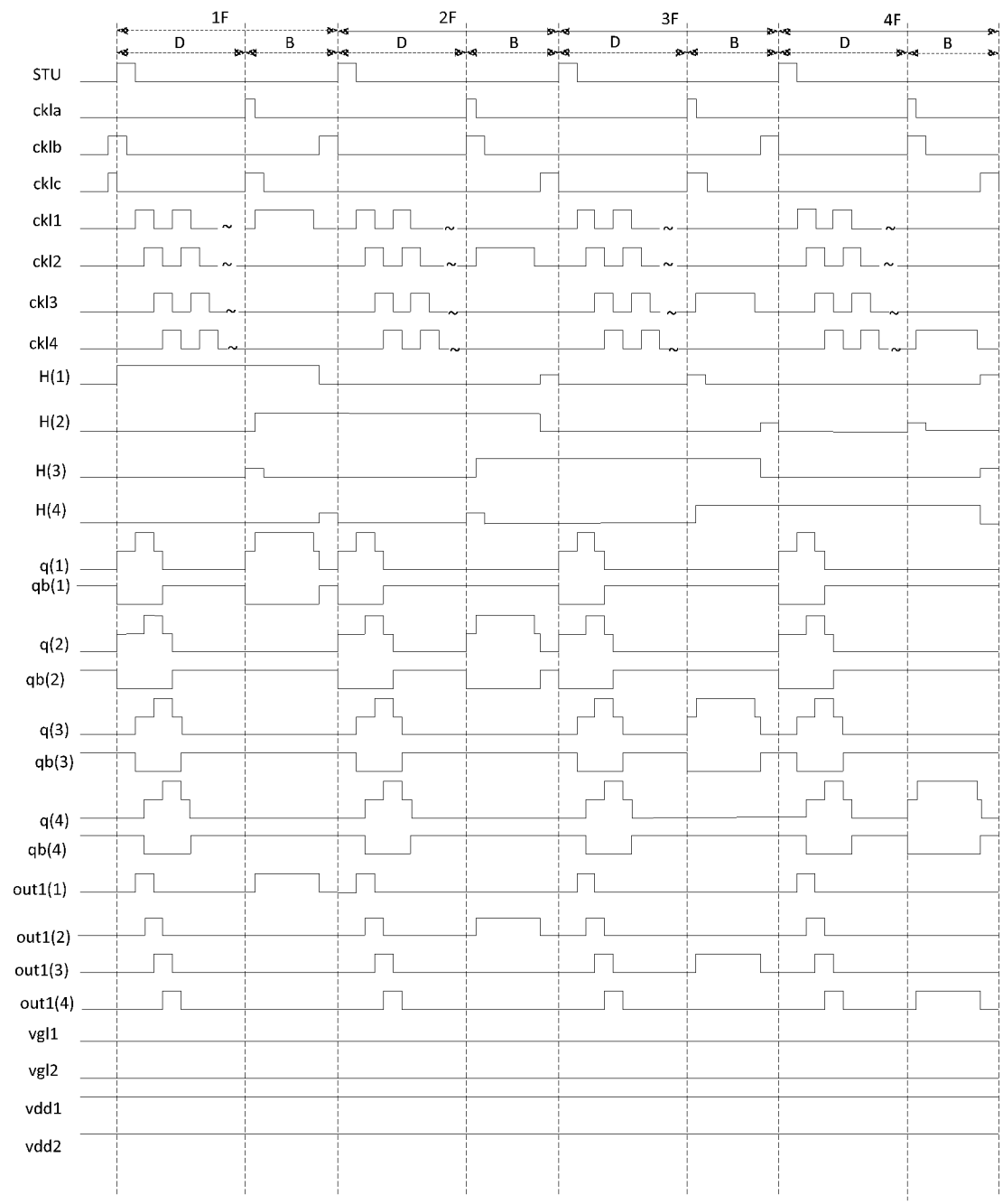
FIG. 8 is an operating timing diagram of a shift register circuit according to an exemplary embodiment of the present disclosure.

The working process of the shift register circuit in FIG. 7 is described below with reference to the operating timing diagram in FIG. 8. It is to be noted that the structure of the shift register unit in FIG. 7 is as shown in FIG. 1, and all the switching elements in FIG. 1 are N-type thin film transistors. FIG. 8 illustrates the drive signal STU, the first clock signal ckla, the second clock signal cklb, the third clock signal cklc, the sixth clock signal ckl1, the seventh clock signal ckl2, the eighth clock signal ckl3, the ninth clock signal Ckl4, the signal H(1) of the first terminal of the first storage capacitor C1 in the first stage shift register unit GOA1, the signal H(2) of the first terminal of the first storage capacitor C1 in the second stage shift register unit GOA2, the signal H(3) of the first terminal of the first storage capacitor C1 in the third stage shift register unit GOA3, the signal H(4) of the first terminal of the first storage capacitor C1 in the fourth stage shift register unit GOA4, the signal q(1) of the pull-up node Q in the first stage shift register unit GOA1, the signal qb(1) of the pull-down node QB in the first stage shift register unit GOA1, the signal q(2) of the pull-up node Q in the second stage shift register unit GOA2, the signal qb(2) of the pull-down node QB in the second stage shift register unit GOA2, the signal q(3) of the pull-up node Q in the third stage shift register unit GOA3, the signal qb(3) of the pull-down node QB in the third stage shift register unit GOA3, the signal q(4) of the pull-up node Q in the fourth stage shift register unit GOA4, the signal qb(4) of the pull-down node QB in the fourth stage shift register unit GOA4, the signal out1(1) of the first signal output terminal OUT1 of the first stage shift register unit GOA1, the signal out1(2) of the first signal output terminal OUT1 of the second stage shift register unit GOA2, the signal out1(3) of the first signal output terminal OUT1 of the third stage shift register unit GOA3, the signal out1(4) of the first signal output terminal OUT1 of the fourth stage shift register unit GOA4, the first power signal vgl1, the second power signal vdd1, the third power signal vdd2, and the fourth power signal vgl2. All the switching elements in the shift register unit are N-type thin film transistors. Therefore, the first power signal vgl1 is at a low level, the second power signal vdd1 is at a high level, the third power signal vdd2 is at a high level, and the fourth power signal vgl2 is at a low level. It is to be noted that the low level of the first power signal vgl1 is lower than the low level of the fourth power signal vgl2. The signal of the output terminal OCR of the shift register unit of each stage is the same as the signal of the first signal output terminal OUT1 thereof. Therefore, the signal of the output terminal OCR of the shift register unit of each stage is not shown in FIG. 8.

According to the connection mode in FIG. 7, the fourth clock signal ckld in FIG. 2 is equivalent to the sixth clock signal ckl1 in FIG. 8, the signal H of the first terminal of the first storage capacitor C1 in FIG. 2 is equivalent to the signal H(1) of the first terminal of the first storage capacitor C1 in the first stage shift register unit GOA1 in FIG. 8, the signal q of the pull-up node Q in FIG. 2 is equivalent to the signal q(1) of the pull-up node Q in the first stage shift register unit GOA1 in FIG. 8, the signal qb of the pull-down node QB in FIG. 2 is equivalent to the signal qb(1) of the pull-down node QB in the first stage shift register unit GOA1 in FIG. 8, the signal out1 of the first signal output terminal OUT1 in FIG. 2 is equivalent to the signal out1(1) of the first signal output terminal OUT1 of the first stage shift register unit GOA1 in FIG. 8, the signal input3 of the third input terminal INPUT3 in FIG. 2 is equivalent to the signal of the output terminal OCR of the fourth stage shift register unit GOA4 in FIG. 8 (i.e., the first signal output terminal out1(4) of the fourth stage shift register unit GOA4). Therefore, the timing diagram of the first stage shift register unit GOA1 in FIG. 8 is the same as that of the shift register unit in FIG. 2, and thus the working process of the first stage shift register unit GOA1 is not described any more.

For the second stage shift register unit GOA2, the first display frame (1F) includes a display phase (D) and a black insertion phase (B).

In the display phase (D), the drive signal STU is at a high level, the signal out1(1) of the output terminal OUT1 of the first stage shift register unit GOA1 is at a low level, the first clock signal ckla is at a low level, the second clock signal cklb is at a high level, the third clock signal cklc is at a low level, the seventh clock signal ckl2 is at a low level, and the signal of the output terminal of the fifth stage shift register unit (not shown in the figure) is at a low level. The fifth switching element M5 is turned on under the action of the drive signal STU, and the second power signal vdd1 is transmitted to the pull-up node Q to charge the second storage capacitor C2. At this moment, the signal q(2) of the pull-up node Q is at a high level. The seventh switching element M7 is turned on under the action of the signal q(2) of the pull-up node Q to transmit the first power signal vgl1 to the pull-down node QB, such that the eighth switching element M8, the ninth switching element M9, the tenth switching element M10, and the eleventh switching element M11 are turned off. In the meantime, both the fifteenth switching element M15 and the sixteenth switching element M16 are turned on under the action of the signal q(2) of the pull-up node Q, and the seventh clock signal ckl2 is transmitted to the output terminal OCR and the first signal output terminal OUT1. At this moment, the seventh clock signal ckl2 is at a low level, and thus, the signal of the output terminal OCR and the signal out1(2) of the first signal output terminal OUT1 are both at a low level. Next, the second clock signal cklb is at a low level. When the second clock signal cklb is at a low level, the pull-up node Q is still at a high level, the signal of the output terminal OCR and the signal out1(2) of the first signal output terminal OUT1 is still the seventh clock signal ckl2. At this moment, the seventh clock signal ckl2 is at a low level, and thus, the signal of the output terminal OCR and the signal out1(2) of the first signal output terminal OUT1 are both still at a low level. Next, the drive signal STU is at a low level, the signal of the output terminal OCR of the first stage shift register unit GOA1 is at a high level, and the fifth switching element M5 is turned off under the action of the drive signal STU. Because of the second power signal vdd1 stored in the second storage capacitor C2, the pull-up node Q is still at a high level at this moment, and the signal of the output terminal OCR and the signal out1(2) of the first signal output terminal OUT1 are still the seventh clock signal ckl2. Because the seventh clock signal ckl2 is at a low level at this moment, the signal of the output terminal OCR and the signal out1(2) of the first signal output terminal OUT1 are both at a low level. Next, the seventh clock signal ckl2 is at a high level, and the signal of the output terminal OCR and the signal out1(2) of the first signal output terminal OUT1 are also changed into a high level. Under the bootstrap action of the second storage capacitor C2, when the signal of the output terminal OCR is changed into a high level, a high level of the output terminal OCR is added for the signal q(2) of the pull-up node Q on the basis of the original high level. Next, the seventh clock signal ckl2 is at a low level, and the signal of the output terminal OCR and the signal out1(2) of the first signal output terminal OUT1 are both at a low level. At this moment, the signal q(2) of the pull-up node Q is back into the original high level under the bootstrap action of the second storage capacitor C2. Next, the signal of the output terminal of the fifth stage shift register unit is at a high level, the twelfth switching element M12 and the thirteenth switching element M13 are turned on under the action of the signal of the output terminal of the fifth stage shift register unit, such that the first power signal vgl1 is transmitted to the pull-up node Q through the twelfth switching element M12 and the thirteenth switching element M13 to reset the pull-up node Q. In the meantime, the third power signal vdd2 is transmitted to the pull-down node QB through the sixth switching element M6, such that the signal qb(2) of the pull-down node QB is changed into a high level. The eighth switching element M8, the ninth switching element M9, the tenth switching element M10, and the eleventh switching element M11 are turned on under the action of the signal of the pull-down node QB, such that the first power signal vgl1 is transmitted to the pull-up node Q and the output terminal OCR through the eighth switching element M8, the ninth switching element M9 and the tenth switching element M10 to continuously denoise the pull-up node Q and the output terminal OCR. Meanwhile, the fourth power signal vgl2 is transmitted to the first signal output terminal OUT1 through the eleventh switching element M11 to continuously denoise the first signal output terminal OUT1.

In the black insertion stage (B), the first clock signal ckla is at a high level, the third clock signal cklc is at a high level, and the output terminal OCR of the first stage shift register unit GOA1 is at a low level. Both the third switching element M3 and fourth switching element M4 are turned on under the action of the first clock signal ckla, and the first switching element M1 and the fourteenth switching element M14 are turned on under the action of the third clock signal cklc. The signal of the output terminal OCR of the first stage shift register unit GOA1 is transmitted to the first terminal H(2) of the first storage capacitor C1 through the first switching element M1. At this moment, the signal of the output terminal OCR of the first stage shift register unit GOA1 is at a low level. Therefore, the signal H(2) of the first terminal of the first storage capacitor C1 is at a low level at this moment. Also, at this moment, the signal q(2) of the pull-up node Q is at a low level, the signal qb(2) of the pull-down node QB is at a high level, and thus, the signal of the output terminal OCR and the signal out1(2) of the first signal output terminal OUT1 are both at a low level. Next, the first clock signal ckla is at a low level, the signal of the output terminal OCR of the first stage shift register unit GOA1 is at a high level, and both the third switching element M3 and the fourth switching element M4 are turned off under the action of the first clock signal ckla. Since the third clock signal cklc is still at a high level, the signal of the output terminal OCR of the first stage shift register unit GOA1 is transmitted to the first terminal of the first storage capacitor C1 through the first switching element M1 to charge the first storage capacitor C1. At this moment, the signal H(2) of the first terminal of the first storage capacitor C1 is at a high level. Because the pull-up node Q is at a low level and the pull-down node QB is at a high level at this moment, the signal of the output terminal OCR and the signal out1(2) of the first signal output terminal OUT1 are still at a low level. Next, the third clock signal cklc is at a low level, and both the first switching element M1 and the fourteenth switching element M14 are turned off. At this moment, the pull-up node Q is always at a low level, the pull-down node QB is always at a high level, thus, the signal of the output terminal OCR and the signal out1(2) of the first signal output terminal OUT1 are still at a low level.

A second display frame (2F) includes a display phase (D) and a black insertion phase (B).

In the display phase (D), first, the drive signal STU is at a high level, the fifth switching element M5 is turned on under the action of the drive signal STU, such that the second power signal vdd1 is transmitted to the pull-up node Q through the fifth switching element M5 to charge the second storage capacitor C2. At this moment, the signal q(2) of the pull-up node Q is at a high level, the seventh switching element M7 is turned on under the action of the signal q(2) of the pull-up node Q, such that the first power signal vgl1 is transmitted to the pull-down node QB, and the eighth switching element M8, the ninth switching element M9, the tenth switching element M10, and the eleventh switching element M11 are turned off under the action of the signal qb(2) of the pull-down node QB. In the meantime, both the fifteenth switching element M15 and the sixteenth switching element M16 are turned on under the action of the signal q(2) of the pull-up node Q, such that the seventh clock signal ckl2 is transmitted to the output terminal OCR and the first signal output terminal OUT1. At this moment, the seventh clock signal ckl2 is at a low level, and thus, the output terminal OCR and the first signal output terminal OUT1 are both at a low level. Next, the seventh clock signal ckl2 is at a high level, the signal of the output terminal OCR and the signal out1(2) of the first signal output terminal OUT1 are both at a high level. Meanwhile, a high level of the output terminal OCR is added for the signal q(2) of the pull-up node Q on the basis of the original high level under the bootstrap action of the second storage capacitor C2. In this phase, the signal of the output terminal OCR of the first stage shift register unit GOA1 is at a high level. At this moment, the first clock signal ckla, the second clock signal cklb and the third clock signal cklc are all at a low level. Therefore, the signal of the output terminal OCR of the first stage shift register unit GOA1 does not affect the signal of the pull-up node Q. Next, the seventh clock signal ckl2 is at a low level, the signal of the output terminal OCR and the signal out1(1) of the first signal output terminal OUT1 are both at a low level. At this moment, the signal of the pull-up node Q is back into the original high level under the bootstrap action of the second storage capacitor C2. Next, the signal of the output terminal of the fifth stage shift register unit is at a high level, the twelfth switching element M12 and the thirteenth switching element M13 are turned on under the action of the signal of the output terminal of the fifth stage shift register unit, such that the first power signal vgl1 is transmitted to the pull-up node Q to reset the pull-up node Q. In the meantime, the third power signal vdd2 is transmitted to the pull-down node QB through the sixth switching element M6, such that the signal of the pull-down node QB is changed into a high level. The eighth switching element M8, the ninth switching element M9, the tenth switching element M10, and the eleventh switching element M11 are turned on under the action of the signal qb(2) of the pull-down node QB, such that the first power signal vgl1 is transmitted to the pull-up node Q and the pull-down node QB through the eighth switching element M8, the ninth switching element M9 and the tenth switching element M10 to continuously denoise the pull-up node Q and the pull-down node QB. Meanwhile, the fourth power signal vgl2 is transmitted to the first signal output terminal OUT1 through the eleventh switching element M11 to continuously denoise the first signal output terminal OUT1. At this moment, the signal of the output terminal OCR and the signal out1(2) of the first signal output terminal OUT1 are both at a low level.

In the black insertion phase (B), the first clock signal ckla is at a high level, the second clock signal cklb is at a high level, and both the third switching element M3 and fourth switching element M4 are turned on under the action of the first switching element M1. Since the signal H(2) of the first terminal of the first storage capacitor C1 is at a high level, the second switching element M2 is turned on, such that the second clock signal cklb is transmitted to the pull-up node Q through the second switching element M2, the third switching element M3 and the fourth switching element M4 to charge the second storage capacitor C2. At this moment, the signal q(2) of the pull-up node Q is at a high level, the seventh switching element M7 is turned on under the action of the signal q(2) of the pull-up node Q. The first power signal vgl1 is transmitted to the pull-down node QB, such that the eighth switching element M8, the ninth switching element M9, the tenth switching element M10, and the eleventh switching element M11 are turned off. In the meantime, the fifteenth switching element M15 and the sixteenth switching element M16 are turned on under the action of the signal q(2) of the pull-up node Q, such that the seventh clock signal ckl2 is transmitted to the output terminal OCR and the first signal output terminal OUT1. Because at this moment the seventh clock signal ckl2 is at a low level, the signal of the output terminal OCR and the signal out1(2) of the first signal output terminal OUT1 are both at a low level. Next, the first clock signal ckla is at a low level, the seventh clock signal ckl2 is at a high level, both the third switching element M3 and the fourth switching element M4 are turned off under the action of the first clock signal ckla. Since the seventh clock signal ckl2 is at a high level at this moment, the signal of the output terminal OCR and the signal out1(2) of the first signal output terminal OUT1 are both at a high level. Meanwhile, a high level of the output terminal OUT1 is added for the signal q(2) of the pull-up node Q on the basis of the original high level under the bootstrap action of the second storage capacitor C2. Next, the second clock signal cklb is at a low level. Since the first clock signal ckla is at a low level, the second clock signal cklb does not affect the signal q(2) of the pull-up node Q, and thus, the signal of the output terminal OCR and the signal out(2) of the first signal output terminal OUT1 are still at a high level. Next, the seventh clock signal cgl2 is at a low level, and the signal of the output terminal OCR and the signal out(2) of the first signal output terminal OUT1 are also at a low level. At this moment, the signal q(2) of the pull-up node Q is back into the original high level under the bootstrap action of the second storage capacitor C2. Next, the third clock signal cklc is at a high level, such that the first switching element M1 and the fourteenth switching element M14 are turned on, and the signal of the output terminal OCR of the first stage shift register unit GOA1 is transmitted to the first terminal of the first storage capacitor C1. Because the signal of the output terminal OCR of the first stage shift register unit GOA1 is at a low level, the signal H(2) of the first terminal of the first storage capacitor C1 is at a low level. Meanwhile, the first power signal vgl1 is transmitted to the pull-up node Q through the fourteenth switching element M14 to reset the pull-up node Q. In the meantime, the third power signal vdd2 is transmitted to the pull-down node QB through the sixth switching element M6, such that the signal qb(2) of the pull-down node QB is at a high level. At this moment, the eighth switching element M8, the ninth switching element M9, the tenth switching element M10, and the eleventh switching element M11 are turned on, such that the first power signal vgl1 is transmitted to the pull-up node Q and the output terminal OCR through the eighth switching element M8, the ninth switching element M9 and the tenth switching element M10 to continuously denoise the pull-up node Q and the output terminal OCR. Meanwhile, the fourth power signal vgl2 is transmitted to the first signal output terminal OUT1 through the eleventh switching element M11 to continuously denoise the first signal output terminal OUT1.

A third display frame (3F) includes a display phase (D) and a black insertion phase (B).

In the display phase (D), the drive signal STU is at a high level, the fifth switching element M5 is turned on, and the second power signal vdd1 is transmitted to the pull-up node Q through the fifth switching element M5, such that the signal q(2) of the pull-up node Q is changed into a high level, and meanwhile the second storage capacitor C2 is charged. The seventh switching element M7 is turned on under the action of the signal q(2) of the pull-up node Q to transmit the first power signal vgl1 to the pull-down node QB, such that the signal qb(2) of the pull-down node QB is changed into a low level, and the eighth switching element M8, the ninth switching element M9, the tenth switching element M10, and the eleventh switching element M11 are turned off under the action of the pull-down node QB. In the meantime, both the fifteenth switching element M15 and the sixteenth switching element M16 are turned on, such that the seventh clock signal ckl2 is transmitted to the output terminal OCR and the first signal output terminal OUT1. At this moment, the seventh clock signal ckl2 is at a low level, and thus the signal of the output terminal OCR and the signal out1(2) of the first signal output terminal OUT1 are both at a low level. Next, the drive signal STU is at a low level, and the output terminal OCR of the first stage shift register unit GOA1 is at a high level. At this moment, the fifth switching element M5 is turned on under the action of the drive signal STU. However, under the action of the signal stored in the second storage capacitor C2, the pull-up node Q is still at a high level. At this moment, the signal of the output terminal OCR and the signal out1(2) of the first signal output terminal OUT1 are still the seventh clock signal ckl2. Because the seventh clock signal ckl2 is at a low level at this moment, the signal of the output terminal OCR and the signal out1(2) of the first signal output terminal OUT1 are both at a low level. Meanwhile, the signal of the output terminal OCR of the first stage shift register unit GOA1 is at a high level, but the third clock signal cklc is at a low level. Therefore, the signal of the output terminal OCR of the first stage shift register unit GOA1 does not affect the signal q(2) of the pull-up node Q. Next, the seventh clock signal ckl2 is at a high level and, at this moment, the signal of the output terminal OCR and the signal out1(2) of the first signal output terminal OUT1 are changed into a high level according to the seventh clock signal ckl2. In the meantime, a high level of the output terminal OCR is added for the signal q(2) of the pull-up node Q on the basis of the original high level under the bootstrap action of the second storage capacitor C2. Next, the seventh clock signal ckl2 is at a low level, and the signal of the output terminal OCR and the signal out1(2) of the first signal output terminal OUT1 are both at a low level. At this moment, the signal q(2) of the pull-up node Q is back into the original high level under the bootstrap action of the second storage capacitor C2. Next, the signal of the output terminal of the fifth stage shift register unit is at a high level, the twelfth switching element M12 and the thirteenth switching element M13 are turned on, such that the first power signal vgl1 is transmitted to the pull-up node Q through the twelfth switching element M12 and the thirteenth switching element M13 to reset the pull-up node Q. In the meantime, the third power signal vdd2 is transmitted to the pull-down node QB through the sixth switching element M6, such that the pull-down node QB is at a high level. The eighth switching element M8, the ninth switching element M9, the tenth switching element M10, and the eleventh switching element M11 are turned on under the action of the signal of the pull-down node QB, such that the first power signal vgl1 is transmitted to the pull-up node Q and the output terminal OCR through the eighth switching element M8, the ninth switching element M9 and the tenth switching element M10 to continuously denoise the pull-up node Q and the output terminal OCR. Meanwhile, the fourth power signal vgl2 is transmitted to the first signal output terminal OUT1 through the eleventh switching element M11 to continuously denoise the first signal output terminal OUT1.

In the black insertion phase (B), the signal H(2) of the first terminal of the first storage capacitor C1 is always at a low level in this phase, and thus, the second switching element M2 is always off. Therefore, the detection input circuit 101 does not have any effect on the signal q(2) of the pull-up node Q. In this phase, the pull-down node QB is at a high level and the pull-up node Q is at a low level. Therefore, the output terminal OCR and the first signal output terminal OUT1 are also at a low level.

A third display frame (3F) includes a display phase (D) and a black insertion phase (B).

In the display phase (D), the first clock signal ckla, the second clock signal cklb and the third clock signal cklc are always at a low level. Therefore, the signal H(2) of the first terminal of the first storage capacitor C1 is always at a low level no matter whether the signal of the output terminal OCR of the first stage shift register unit GOA1 is at a high level or at a low level. Meanwhile, the signal of the detection input circuit 101 is not transmitted to the pull-up node Q. Therefore, the working process of the detection input circuit 101 is omitted in the following description of the working process of the display phase (D).

First, the drive signal STU is at a high level, the fifth switching element M5 is turned on under the action of the drive signal STU, and the second power signal vdd1 is transmitted to the pull-up node Q, such that the signal q(2) of the pull-up node Q is changed into a high level to charge the second storage capacitor C2. The seventh switching element M7 is turned on under the action of the signal q(2) of the pull-up node Q to transmit the first power signal vgl1 to the pull-down node QB, such that the signal qb(2) of the pull-down node QB is changed into a low level. At this moment, the eighth switching element M8, the ninth switching element M9, the tenth switching element M10, and the eleventh switching element M11 are turned off under the action of the signal qb(2) of the pull-down node QB. In the meantime, both the fifteenth switching element M15 and the sixteenth switching element M16 are turned on under the action of the signal q(2) of the pull-up node Q, such that the seventh clock signal ckl2 is transmitted to the output terminal OCR and the first signal output terminal OUT1. At this moment, the seventh clock signal ckl2 is at a low level, and thus, the signal of the output terminal OCR and the signal of the first signal output terminal OUT1 are both at a low level. Next, the drive signal STU is at a low level, and the fifth switching element M5 is turned off under the action of the drive signal STU. Under the action of the signal stored in the second storage capacitor C2, the pull-up node Q is still at a high level, and the signal of the output terminal OCR and the signal of the first signal output terminal OUT1 are still the seventh clock signal ckl2. Because the first clock signal ckla is at a low level at this moment, the signal of the output terminal OCR and the signal out1(2) of the first signal output terminal OUT1 are still at a low level. Next, the seventh clock signal ckl2 is at a high level, and the output terminal OCR and the first signal output terminal OUT1 are also changed into a high level. Under the bootstrap action of the second storage capacitor C2, when the signal of the output terminal OCR is at a high level, a high level of the output terminal OCR is added for the signal q(2) of the pull-up node Q on the basis of the original high level. Next, the seventh clock signal ckl2 is at a low level, and the signal of the output terminal OCR and the signal out1(2) of the first signal output terminal OUT1 are both changed into a low level. At this moment, when the signal of the output terminal OCR is changed into a low level, the signal q(2) of the pull-up node Q is back into the original high level under the bootstrap action of the second storage capacitor C2. Next, the signal of the output terminal of the fifth stage shift register unit is at a high level, the twelfth switching element M12 and the thirteenth switching element M13 are turned on, such that the first power signal vgl1 is transmitted to the pull-up node Q to reset the pull-up node Q. At this moment, the seventh switching element M7 is turned off, and the third power signal vdd2 is transmitted to the pull-down node QB through the sixth switching element M6, such that the eighth switching element M8, the ninth switching element M9, the tenth switching element M10, and the eleventh switching element M11 are turned on, and the first power signal vgl1 is transmitted to the pull-up node Q and the output terminal OCR through the eighth switching element M8, the ninth switching element M9, and the tenth switching element M10 to continuously denoise the pull-up node Q and the output terminal OCR. Meanwhile, the fourth power signal vgl2 is transmitted to the first signal output terminal OUT1 through the eleventh switching element M11 to continuously denoise the first signal output terminal OUT1. At this moment, the signal of the output terminal OCR and the signal out1(2) of the first signal output terminal OUT1 are both at a low level.

In the black insertion phase (B), the signal of the output terminal OCR of the first stage shift register unit GOA1 is always at a low level in this phase, and thus, the signal H(2) of the first terminal of the first storage capacitor C1 is always at a low level. Therefore, the second clock signal cklb cannot be transmitted to the pull-up node Q. That is, the detection input unit 101 does not affect the signal q(2) of the pull-up node Q. Furthermore, the drive signal STU is also at a low level. Therefore, in this phase, the signal of the output terminal OCR and the signal out1(2) of the first signal output terminal OUT1 both are always at a low level.

A fourth display frame (4F) includes a display phase (D) and a black insertion phase (B).

In the display phase (D), the first clock signal ckla, the second clock signal cklb and the third clock signal cklc are always at a low level. Therefore, the signal H(2) of the first terminal of the first storage capacitor C1 is always at a low level no matter whether the signal of the output terminal of the first stage shift register unit GOA1 is at a high level or at a low level. Meanwhile, the signal of the detection input circuit 101 is not transmitted to the pull-up node Q. Therefore, the working process of the detection input circuit 101 is omitted in the following description of the working process of the display phase (D).

First, the drive signal STU is at a high level, the fifth switching element M5 is turned on under the action of the drive signal STU, and the second power signal vdd1 is transmitted to the pull-up node Q, such that the signal q(2) of the pull-up node Q is changed into a high level to charge the second storage capacitor C2. The seventh switching element M7 is turned on under the action of the signal q(2) of the pull-up node Q, the first power signal vgl1 is transmitted to the pull-down node QB, such that the signal qb(2) of the pull-down node QB is changed into a low level. At this moment, the eighth switching element M8, the ninth switching element M9, the tenth switching element M10, and the eleventh switching element M11 are turned off under the action of the signal qb(2) of the pull-down node QB. In the meantime, both the fifteenth switching element M15 and the sixteenth switching element M16 are turned on under the action of the signal of the pull-up node Q, such that the seventh clock signal ckl2 is transmitted to the output terminal OCR and the first signal output terminal OUT1. At this moment, the seventh clock signal ckl2 is at a low level, and thus, the signal of the output terminal OCR and the signal out1(2) of the first signal output terminal OUT1 are both at a low level. Next, the drive signal STU is at a low level, the fifth switching element M5 is turned off under the action of the drive signal STU, but the pull-up node Q is still at a high level under the action of the signal stored in the second storage capacitor C2, and both the output terminal OCR and the first signal output terminal OUT1 still output the seventh clock signal ckl2. At this moment, because the seventh clock signal ckl2 is at a low level, the signal of the output terminal OCR and the signal out1(2) of the first signal output terminal OUT1 both are still at a low level. Next, the seventh clock signal ckl2 is changed into a high level, and the signal of the output terminal OCR and the signal out1(2) of the first signal output terminal OUT1 both are also changed into a high level. Under the bootstrap action of the second storage capacitor C2, when the signal of the output terminal OCR is at a high level, a high level of the output terminal OCR is added for the signal q(2) of the pull-up node Q on the basis of the original high level. Next, the seventh clock signal ckl2 is changed into a low level, and the signal of the output terminal OCR and the signal out1(2) of the first signal output terminal OUT1 both are also changed into a low level. At this moment, under the bootstrap action of the second storage capacitor C2, when the signal of the output terminal OCR is changed into a low level, the signal q(2) of the pull-up node Q is back into the original high level. Next, the signal of the output terminal of the fifth stage shift register unit is at a high level, the twelfth switching element M12 and the thirteenth switching element M13 are both turned on, such that the first power signal vgl1 is transmitted to the pull-up node Q to reset the pull-up node Q. At this moment, the seventh switching element M7 is turned off, and the third power signal vdd2 is transmitted to the pull-down node QB through the sixth switching element M6, such that the eighth switching element M8, the ninth switching element M9, the tenth switching element M10, and the eleventh switching element M11 are turned on. The first power signal vgl1 is transmitted to the pull-up node Q and the output terminal OCR through the eighth switching element M8, the ninth switching element M9 and the tenth switching element M10 to continuously denoise the pull-up node Q and the output terminal OCR. Meanwhile, the fourth power signal vgl2 is transmitted to the first signal output terminal OUT1 through the eleventh switching element M11 to continuously denoise the first signal output terminal OUT1. At this moment, the signal of the output terminal OCR and the signal of the first signal output terminal OUT1 are both at a low level.

In the black insertion phase (B), as can be seen from the timing diagram, in this phase, the second switching element M2, the third switching element M3 and the fourth switching element M4 cannot be turned on at the same time. Therefore, the signal of the detection input circuit 101 cannot be transmitted to the pull-up node Q. That is, the signal of the detection input circuit 101 cannot exert an effect on the signal q(2) of the pull-up node Q. Furthermore, because the drive signal STU is always at a low level in this phase, the signal of the output terminal OCR and the signal out1(2) of the first signal output terminal OUT1 are always at a low level.

It is to be noted that working principles of the third stage shift register unit GOA3 and the fourth stage shift register unit are the same as those of the first stage shift register unit GOA1 and the second stage shift register unit GOA2, and thus, their detailed descriptions are omitted herein.

As can be seen from the timing diagram in FIG. 8, the signal out1(1) of the first signal output terminal OUT1 of the first stage shift register unit GOA1 is overlapped with the signal out1(2) of the first signal output terminal OUT1 of the second stage shift register unit GOA2, the signal out1(2) of the first signal output terminal OUT1 of the second stage shift register unit GOA2 is overlapped with the signal out1(3) of the first signal output terminal OUT1 of the third stage shift register unit GOA3, and the signal out1(3) of the first signal output terminal OUT1 of the third stage shift register unit GOA3 is overlapped with the signal out1(4) of the first signal output terminal OUT1 of the fourth stage shift register unit GOA4. That is, signals outputted from the first signal output terminals of the respective shift register units are overlapped with each other. Therefore, each gate line may be precharged, and thus, data writing time may be greatly increased, thereby avoiding the phenomenon of abnormal display.

This exemplary embodiment also proposes a display device, which may include the above shift register unit or the above shift register circuit. In this exemplary embodiment, the display device includes a display region and a peripheral region. The peripheral region of the display device may be provided with the above shift register circuit, and the shift register circuit at least includes one of the above shift register units. On this basis, the display region of the display device may include a plurality of gate lines and a plurality of data lines crisscrossed, and a plurality of pixel units defined by the adjacent gate lines and the adjacent data lines. The gate line is configured to transmit an output signal provided by the shift register circuit, and the data line is configured to transmit a data signal provided by a source driver. The display device may be any product or component having a display function, such as a mobile phone, a tablet computer, a television (TV) set, a notebook computer, a digital photo frame, a navigation device and so on.

It is to be noticed that although a plurality of modules or units of the device for action execution have been mentioned in the above detailed description, this partition is not compulsory. Actually, according to the embodiment of the present disclosure, features and functions of two or more modules or units as described above may be embodied in one module or unit. Reversely, features and functions of one module or unit as described above may be further embodied in more modules or units.

In addition, steps of the method in the present disclosure are described in a particular order in the accompanying drawings. However, this does not require or imply to execute these steps necessarily according to the particular order, nor does this mean that the expected result cannot be implemented unless all the shown steps are executed. Additionally or alternatively, some steps may be omitted, a plurality of steps may be combined into one step for execution, and/or one step may be decomposed into a plurality of steps for execution.

Other embodiments of the present disclosure will be apparent to those skilled in the art from consideration of the specification and practice of the invention disclosed herein. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the appended claims.

What is claimed is:

1. A shift register unit, comprising:
   a detection input circuit coupled to a first clock signal terminal, a second clock signal terminal, a third clock signal terminal, a first input terminal, a first power signal terminal, a pull-up node and a first node, and configured to transmit a signal from the third clock signal terminal to the pull-up node in response to a signal from the first clock signal terminal and a signal from the second clock signal terminal;
   a display input circuit coupled to a second input terminal, the pull-up node, and a second power signal terminal, and configured to transmit a signal from the second power signal terminal to the pull-up node in response to a signal from the second input terminal;
   an inverter circuit coupled to a third power signal terminal, the pull-up node, a pull-down node, the first node, and the first power signal terminal, and configured to transmit a signal from the third power signal terminal to the pull-down node in response to the signal from the third power signal terminal, transmit a signal from the first power signal terminal to the pull-down node in response to a signal from the pull-up node, and transmit the signal from the first power signal terminal to the pull-up node in response to a signal from the pull-down node;
   a pull-down circuit coupled to the pull-down node, the first power signal terminal, a fourth power signal terminal, an output terminal, and a first signal output terminal, and configured to, in response to the signal from the pull-down node, transmit the signal from the first power signal terminal to the output terminal and transmit a signal from the fourth power signal terminal to the first signal output terminal;
   a reset circuit coupled to the second clock signal terminal, the pull-up node, the first power signal terminal, a third input terminal, and the first node, and configured to transmit the signal from the first power signal terminal to the pull-up node in response to the signal from the second clock signal terminal and transmit the signal from the first power signal terminal to the pull-up node in response to a signal from the third input terminal; and
   a first output circuit coupled to a fourth clock signal terminal, the pull-up node, the output terminal, and the first signal output terminal, and configured to transmit a signal from the fourth clock signal terminal to the output terminal and the first signal output terminal in response to the signal from the pull-up node.

2. The shift register unit according to claim 1, further comprising:
   a feedback circuit coupled to the pull-up node, the first node, and the second power signal terminal, and configured to communicate the second power signal terminal with the first node in response to the signal from the pull-up node;
   wherein the feedback circuit comprises a seventeenth switching element, a control terminal of the seventeenth switching element is coupled to the pull-up node, a first terminal of the seventeenth switching element is coupled to the second power signal terminal, and a second terminal of the seventeenth switching element is coupled to the first node.

3. The shift register unit according to claim 1, further comprising:
a feedback circuit coupled to the output terminal, the first signal output terminal, and the first node, and configured to communicate the first signal output terminal with the first node in response to a signal from the output terminal;
wherein the feedback circuit comprises a seventeenth switching element, a control terminal of the seventeenth switching element is coupled to the output terminal, a first terminal of the seventeenth switching element is coupled to the first node, and a second terminal of the seventeenth switching element is coupled to the first signal output terminal.

4. The shift register unit according to claim 1, wherein:
the third power signal terminal comprises a first power subsignal terminal and a second power subsignal terminal; and
the inverter circuit is coupled to the first power subsignal terminal, the second power subsignal terminal, the pull-up node, the pull-down node, the first node, and the first power signal terminal, and is configured to:
alternately transmit a signal from the first power subsignal terminal and a signal from the second power subsignal terminal to the pull-down node in alternate response to the signal from the first power subsignal terminal and the signal from the second power subsignal terminal;
transmit the signal from the first power signal terminal to the pull-down node in response to the signal from the pull-up node; and
transmit the signal from the first power signal terminal to the pull-up node in response to the signal from the pull-down node, wherein the signal from the first power subsignal terminal and the signal from the second power subsignal terminal are co-frequency reverse signals.

5. The shift register unit according to claim 4, wherein the inverter circuit comprises:
a sixth switching element, a control terminal and a first terminal of the sixth switching element being coupled to the first power subsignal terminal, and a second terminal of the sixth switching element being coupled to the pull-down node;
a seventh switching element, a control terminal of the seventh switching element being coupled to the pull-up node, a first terminal of the seventh switching element being coupled to the pull-down node, and a second terminal of the seventh switching element being coupled to the first power signal terminal;
an eighth switching element, a control terminal of the eighth switching element being coupled to the pull-down node, and a first terminal of the eighth switching element being coupled to the pull-up node;
a ninth switching element, a control terminal of the ninth switching element being coupled to the pull-down node, a first terminal of the ninth switching element being coupled to the second terminal of the eighth switching element, and a second terminal of the ninth switching element being coupled to the first power signal terminal; and
an eighteenth switching element, a control terminal and a first terminal of the eighteenth switching element being coupled to the second power subsignal terminal, and a second terminal of the eighteenth switching element being coupled to the pull-down node.

6. The shift register unit according to claim 1, further comprising:
a current detection subcircuit coupled to the first input terminal, and configured to detect a signal from the first input terminal; and
a signal generation subcircuit coupled to the current detection subcircuit and the second clock signal terminal, and configured to generate an off signal according to the signal from the first input terminal detected by the current detection subcircuit, and transmit the off signal to the second clock signal terminal.

7. The shift register unit according to claim 1, wherein the inverter circuit comprises:
a sixth switching element, a control terminal and a first terminal of the sixth switching element being coupled to the third power signal terminal and a second terminal of the sixth switching element being coupled to the pull-down node;
a seventh switching element, a control terminal of the seventh switching element being coupled to the pull-up node, a first terminal of the seventh switching element being coupled to the pull-down node, and a second terminal of the seventh switching element being coupled to the first power signal terminal;
an eighth switching element, a control terminal of the eighth switching element being coupled to the pull-down node and a first terminal of the eighth switching element being coupled to the pull-up node; and
a ninth switching element, a control terminal of the ninth switching element being coupled to the pull-down node, a first terminal of the ninth switching element being coupled to the second terminal of the eighth switching element, and a second terminal of the ninth switching element being coupled to the first power signal terminal.

8. The shift register unit according to claim 1, wherein:
the detection input circuit comprises:
a first switching element, a control terminal of the first switching element being coupled to the second clock signal terminal, and a first terminal of the first switching element being coupled to the first input terminal;
a first storage capacitor, a first terminal of the first storage capacitor being coupled to a second terminal of the first switching element, and a second terminal of the first storage capacitor being coupled to the first power signal terminal;
a second switching element, a control terminal of the second switching element being coupled to the second terminal of the first switching element, and a first terminal of the second switching element being coupled to the third clock signal terminal;
a third switching element, a control terminal of the third switching element being coupled to the first clock signal terminal, and a first terminal of the third switching element being coupled to a second terminal of the second switching element; and
a fourth switching element, a control terminal of the fourth switching element being coupled to the first clock signal terminal, a first terminal of the fourth switching element being coupled to the second terminal of the third switching element, and a second terminal of the fourth switching element being coupled to the pull-up node;

the display input circuit comprises:
a fifth switching element, a control terminal of the fifth switching element being coupled to the second input terminal, a first terminal of the fifth switching element being coupled to the second power signal terminal, and a second terminal of the fifth switching element being coupled to the pull-up node;

the pull-down circuit comprises:
a tenth switching element, a control terminal of the tenth switching element being coupled to the pull-down node, a first terminal of the tenth switching element being coupled to the output terminal, and a second terminal of the tenth switching element being coupled to the first power signal terminal; and
an eleventh switching element, a control terminal of the eleventh switching element being coupled to the pull-down node, a first terminal of the eleventh switching element being coupled to the first signal output terminal, and a second terminal of the eleventh switching element being coupled to the fourth power signal terminal;

the reset circuit comprises:
a twelfth switching element, a control terminal of the twelfth switching element being coupled to the third input terminal, a first terminal of the twelfth switching element being coupled to the pull-up node, and a second terminal of the twelfth switching element being coupled to the first node;
a thirteenth switching element, a control terminal of the thirteenth switching element being coupled to the third input terminal, a first terminal of the thirteenth switching element being coupled to the first node, and a second terminal of the thirteenth switching element being coupled to the first power signal terminal; and
a fourteenth switching element, a control terminal of the fourteenth switching element being coupled to the second clock signal terminal, a first terminal of the fourteenth switching element being coupled to the pull-up node, and a second terminal of the fourteenth switching element being coupled to the first power signal terminal; and the first output circuit comprises:
a second storage capacitor, a first terminal of the second storage capacitor being coupled to the pull-up node, and a second terminal of the second storage capacitor being coupled to the output terminal;
a fifteenth switching element, a control terminal of the fifteenth switching element being coupled to the pull-up node, a first terminal of the fifteenth switching element being coupled to the fourth clock signal terminal, and a second terminal of the fifteenth switching element being coupled to the output terminal; and
a sixteenth switching element, a control terminal of the sixteenth switching element being coupled to the pull-up node, a first terminal of the sixteenth switching element being coupled to the fourth clock signal terminal, and a second terminal of the sixteenth switching element being coupled to the first signal output terminal.

9. A system, comprising:
a shift register circuit comprising a plurality of shift register units, wherein each of the shift register units comprises:
a detection input circuit coupled to a first clock signal terminal, a second clock signal terminal, a third clock signal terminal, a first input terminal, a first power signal terminal, a pull-up node, and a first node, and configured to transmit a signal from the third clock signal terminal to the pull-up node in response to a signal from the first clock signal terminal and a signal from the second clock signal terminal;
a display input circuit coupled to a second input terminal, the pull-up node, and a second power signal terminal, and configured to transmit a signal from the second power signal terminal to the pull-up node in response to a signal from the second input terminal;
an inverter circuit coupled to a third power signal terminal, the pull-up node, a pull-down node, the first node, and the first power signal terminal, and configured to transmit a signal from the third power signal terminal to the pull-down node in response to the signal from the third power signal terminal, transmit a signal from the first power signal terminal to the pull-down node in response to a signal from the pull-up node, and transmit the signal from the first power signal terminal to the pull-up node in response to a signal from the pull-down node;
a pull-down circuit coupled to the pull-down node, the first power signal terminal, a fourth power signal terminal, an output terminal, and a first signal output terminal, and configured to, in response to the signal from the pull-down node, transmit the signal from the first power signal terminal to the output terminal and transmit a signal from the fourth power signal terminal to the first signal output terminal;
a reset circuit coupled to the second clock signal terminal, the pull-up node, the first power signal terminal, a third input terminal, and the first node, and configured to transmit the signal from the first power signal terminal to the pull-up node in response to the signal from the second clock signal terminal and transmit the signal from the first power signal terminal to the pull-up node in response to a signal from the third input terminal; and
a first output circuit, coupled to a fourth clock signal terminal, the pull-up node, the output terminal and the first signal output terminal and configured to transmit a signal from the fourth clock signal terminal to the output terminal and the first signal output terminal in response to the signal from the pull-up node, wherein:
the first clock signal terminal of the shift register unit in an $N^{th}$ row receives a first clock signal, and the first clock signal terminal of the shift register unit in an $(N+1)^{th}$ row receives the first clock signal;
the second clock signal terminal of the shift register unit in the $N^{th}$ row receives a second clock signal, and the third clock signal terminal of the shift register unit in the $N^{th}$ row receives a third clock signal;
the third clock signal terminal of the shift register unit in the $(N+1)^{th}$ row receives the second clock signal, and the second clock signal terminal of the shift register unit in the $(N+1)^{th}$ row receives the third clock signal;
the output terminal of the shift register unit in the $N^{th}$ row is respectively coupled to the first input terminal of the shift register unit in the $(N+1)^{th}$ row and the second input terminal of the shift register unit in the $(N+2)^{th}$ row;

the output terminal of the shift register unit in the (N+1)$^{th}$ row is respectively coupled to the first input terminal of the shift register unit in the (N+2)$^{th}$ row and the second input terminal of the shift register unit in the (N+3)$^{th}$ row;

the third input terminal of the shift register unit in the N$^{th}$ row is coupled to the output terminal of the shift register unit in the (N+3)$^{th}$ row; and the first input terminal and the second input terminal of the shift register unit in a first row and the second input terminal of the shift register unit in a second row receive a drive signal, wherein the N is one of an odd number and an even number.

10. The system according to claim 9, wherein each of the shift register units further comprise:

a feedback circuit coupled to the pull-up node, the first node, and the second power signal terminal, and configured to communicate the second power signal terminal with the first node in response to the signal from the pull-up node;

wherein the feedback circuit comprises a seventeenth switching element, a control terminal of the seventeenth switching element is coupled to the pull-up node, a first terminal of the seventeenth switching element is coupled to the second power signal terminal, and a second terminal of the seventeenth switching element is coupled to the first node.

11. The system according to claim 9, wherein each of the shift register units further comprise:

a feedback circuit coupled to the output terminal, the first signal output terminal, and the first node, and configured to communicate the first signal output terminal with the first node in response to a signal from the output terminal;

wherein the feedback circuit comprises a seventeenth switching element, a control terminal of the seventeenth switching element is coupled to the output terminal, a first terminal of the seventeenth switching element is coupled to the first node, and a second terminal of the seventeenth switching element is coupled to the first signal output terminal.

12. The system according to claim 9, wherein:

the third power signal terminal comprises a first power subsignal terminal and a second power subsignal terminal; and the inverter circuit is coupled to the first power subsignal terminal, the second power subsignal terminal, the pull-up node, the pull-down node, the first node and the first power signal terminal and is configured to:

alternately transmit a signal from the first power subsignal terminal and a signal from the second power subsignal terminal to the pull-down node in alternate response to the signal from the first power subsignal terminal and the signal from the second power subsignal terminal;

transmit the signal from the first power signal terminal to the pull-down node in response to the signal from the pull-up node; and transmit the signal from the first power signal terminal to the pull-up node in response to the signal from the pull-down node, wherein the signal from the first power subsignal terminal and the signal from the second power subsignal terminal are co-frequency reverse signals.

13. The system according to claim 12, wherein the inverter circuit comprises:

a sixth switching element, a control terminal and a first terminal of the sixth switching element being coupled to the first power subsignal terminal, and a second terminal of the sixth switching element being coupled to the pull-down node;

a seventh switching element, a control terminal of the seventh switching element being coupled to the pull-up node, a first terminal of the seventh switching element being coupled to the pull-down node, and a second terminal of the seventh switching element being coupled to the first power signal terminal;

an eighth switching element, a control terminal of the eighth switching element being coupled to the pull-down node, and a first terminal of the eighth switching element being coupled to the pull-up node;

a ninth switching element, a control terminal of the ninth switching element being coupled to the pull-down node, a first terminal of the ninth switching element being coupled to the second terminal of the eighth switching element, and a second terminal of the ninth switching element being coupled to the first power signal terminal; and an eighteenth switching element, a control terminal and a first terminal of the eighteenth switching element being coupled to the second power subsignal terminal, and a second terminal of the eighteenth switching element being coupled to the pull-down node.

14. The system according to claim 12, further comprising a display device, the display device comprising the shift register circuit.

15. The system according to claim 9, wherein each of the shift register units further comprise:

a current detection subcircuit coupled to the first input terminal, and configured to detect a signal from the first input terminal; and a signal generation subcircuit coupled to the current detection subcircuit and the second clock signal terminal, and configured to generate an off signal according to the signal from the first input terminal detected by the current detection subcircuit, and transmit the off signal to the second clock signal terminal.

16. The system according to claim 9, wherein the inverter circuit comprises:

a sixth switching element, a control terminal and a first terminal of the sixth switching element being coupled to the third power signal terminal, and a second terminal of the sixth switching element being coupled to the pull-down node;

a seventh switching element, a control terminal of the seventh switching element being coupled to the pull-up node, a first terminal of the seventh switching element being coupled to the pull-down node, and a second terminal of the seventh switching element being coupled to the first power signal terminal;

an eighth switching element, a control terminal of the eighth switching element being coupled to the pull-down node, and a first terminal of the eighth switching element being coupled to the pull-up node; and a ninth switching element, a control terminal of the ninth switching element being coupled to the pull-down node, a first terminal of the ninth switching element being coupled to the second terminal of the eighth switching element, and a second terminal of the ninth switching element being coupled to the first power signal terminal.

17. The system according to claim 9, wherein:
the detection input circuit comprises:
- a first switching element, a control terminal of the first switching element being coupled to the second clock signal terminal, and a first terminal of the first switching element being coupled to the first input terminal;
- a first storage capacitor, a first terminal of the first storage capacitor being coupled to the second terminal of the first switching element, and a second terminal of the first storage capacitor being coupled to the first power signal terminal;
- a second switching element, a control terminal of the second switching element being coupled to the second terminal of the first switching element, and a first terminal of the second switching element being coupled to the third clock signal terminal;
- a third switching element, a control terminal of the third switching element being coupled to the first clock signal terminal, and a first terminal of the third switching element being coupled to a second terminal of the second switching element; and
- a fourth switching element, a control terminal of the fourth switching element being coupled to the first clock signal terminal, a first terminal of the fourth switching element being coupled to the second terminal of the third switching element, and a second terminal of the fourth switching element being coupled to the pull-up node;

the display input circuit comprises:
- a fifth switching element, a control terminal of the fifth switching element being coupled to the second input terminal, a first terminal of the fifth switching element being coupled to the second power signal terminal, and a second terminal of the fifth switching element being coupled to the pull-up node;

the pull-down circuit comprises:
- a tenth switching element, a control terminal of the tenth switching element being coupled to the pull-down node, a first terminal of the tenth switching element being coupled to the output terminal, and a second terminal of the tenth switching element being coupled to the first power signal terminal; and
- an eleventh switching element, a control terminal of the eleventh switching element being coupled to the pull-down node, a first terminal of the eleventh switching element being coupled to the first signal output terminal, and a second terminal of the eleventh switching element being coupled to the fourth power signal terminal;

the reset circuit comprises:
- a twelfth switching element, a control terminal of the twelfth switching element being coupled to the third input terminal, a first terminal of the twelfth switching element being coupled to the pull-up node, and a second terminal of the twelfth switching element being coupled to the first node;
- a thirteenth switching element, a control terminal of the thirteenth switching element being coupled to the third input terminal, a first terminal of the thirteenth switching element being coupled to the first node, and a second terminal of the thirteenth switching element being coupled to the first power signal terminal; and
- a fourteenth switching element, a control terminal of the fourteenth switching element being coupled to the second clock signal terminal, a first terminal of the fourteenth switching element being coupled to the pull-up node, and a second terminal of the fourteenth switching element being coupled to the first power signal terminal; and the first output circuit comprises:
- a second storage capacitor, a first terminal of the second storage capacitor being coupled to the pull-up node, and a second terminal of the second storage capacitor being coupled to the output terminal;
- a fifteenth switching element, a control terminal of the fifteenth switching element being coupled to the pull-up node, a first terminal of the fifteenth switching element being coupled to the fourth clock signal terminal, and a second terminal of the fifteenth switching element being coupled to the output terminal; and
- a sixteenth switching element, a control terminal of the sixteenth switching element being coupled to the pull-up node, a first terminal of the sixteenth switching element being coupled to the fourth clock signal terminal, and a second terminal of the sixteenth switching element being coupled to the first signal output terminal.

18. A display device, comprising:
a shift register unit, wherein the shift register unit comprises:
- a detection input circuit coupled to a first clock signal terminal, a second clock signal terminal, a third clock signal terminal, a first input terminal, a first power signal terminal, a pull-up node, and a first node, and configured to transmit a signal from the third clock signal terminal to the pull-up node in response to a signal from the first clock signal terminal and a signal from the second clock signal terminal;
- a display input circuit coupled to a second input terminal, the pull-up node, and a second power signal terminal, and configured to transmit a signal from the second power signal terminal to the pull-up node in response to a signal from the second input terminal;
- an inverter circuit coupled to a third power signal terminal, the pull-up node, a pull-down node, the first node, and the first power signal terminal, and configured to transmit a signal from the third power signal terminal to the pull-down node in response to the signal from the third power signal terminal, transmit a signal from the first power signal terminal to the pull-down node in response to a signal from the pull-up node, and transmit the signal from the first power signal terminal to the pull-up node in response to a signal from the pull-down node;
- a pull-down circuit coupled to the pull-down node, the first power signal terminal, a fourth power signal terminal, an output terminal, and a first signal output terminal, and configured to, in response to the signal from the pull-down node, transmit the signal from the first power signal terminal to the output terminal and transmit a signal from the fourth power signal terminal to the first signal output terminal;
- a reset circuit coupled to the second clock signal terminal, the pull-up node, the first power signal terminal, a third input terminal, and the first node, and configured to transmit the signal from the first power signal terminal to the pull-up node in response to the signal from the second clock signal terminal and transmit the signal from the first power signal terminal to the pull-up node in response to a signal from the third input terminal; and a first output circuit coupled to a fourth clock signal terminal, the pull-up node, the output terminal, and the first signal output terminal, and configured to transmit a signal from the fourth clock signal terminal to the output terminal and the first signal output terminal in response to the signal from the pull-up node.

19. The display device according to claim 18, wherein the shift register unit further comprises:

a feedback circuit coupled to the pull-up node, the first node, and the second power signal terminal, and configured to communicate the second power signal terminal with the first node in response to the signal from the pull-up node;

wherein the feedback circuit comprises a seventeenth switching element, a control terminal of the seventeenth switching element is coupled to the pull-up node, a first terminal of the seventeenth switching element is coupled to the second power signal terminal, and a second terminal of the seventeenth switching element is coupled to the first node.

20. The display device according to claim 18, wherein the shift register unit further comprises:

a feedback circuit coupled to the output terminal, the first signal output terminal, and the first node, and configured to communicate the first signal output terminal with the first node in response to a signal from the output terminal;

wherein the feedback circuit comprises a seventeenth switching element, a control terminal of the seventeenth switching element is coupled to the output terminal, a first terminal of the seventeenth switching element is coupled to the first node, and a second terminal of the seventeenth switching element is coupled to the first signal output terminal.

* * * * *